(12) United States Patent
Abe et al.

(10) Patent No.: US 7,604,858 B2
(45) Date of Patent: Oct. 20, 2009

(54) RELEASE LAYER PASTE AND METHOD OF PRODUCTION OF A MULTILAYER TYPE ELECTRONIC DEVICE

(75) Inventors: Kyotaro Abe, Chuo-ku (JP); Tamotsu Ishiyama, Chuo-ku (JP); Shigeki Sato, Chuo-ku (JP)

(73) Assignee: TDK Corporation, Tokyo (JP)

( * ) Notice: Subject to any disclaimer, the term of this patent is extended or adjusted under 35 U.S.C. 154(b) by 633 days.

(21) Appl. No.: 11/200,184

(22) Filed: Aug. 10, 2005

(65) Prior Publication Data

US 2006/0035072 A1 Feb. 16, 2006

(30) Foreign Application Priority Data

Aug. 10, 2004 (JP) ............................ 2004-233634
Jul. 11, 2005 (JP) ............................ 2005-202093

(51) Int. Cl.
*C08B 29/00* (2006.01)
*B05D 5/00* (2006.01)
*B05D 3/02* (2006.01)
*B32B 18/00* (2006.01)

(52) U.S. Cl. .................... 428/325; 427/258; 427/372.2; 156/89.11; 156/89.12; 524/287

(58) Field of Classification Search ................ 428/325; 156/89.11, 89.12, 289; 427/258, 372.2; 524/287
See application file for complete search history.

(56) References Cited

U.S. PATENT DOCUMENTS

| 6,511,564 B2 * | 1/2003 | Nakamura et al. ........ 156/89.16 |
| 6,544,917 B1 * | 4/2003 | Miyanaga et al. ........... 501/154 |
| 2002/0056641 A1 * | 5/2002 | December ................... 204/484 |
| 2003/0170432 A1 * | 9/2003 | Kobayashi et al. .......... 428/209 |

FOREIGN PATENT DOCUMENTS

| EP | 1 609 771 A1 | 12/2005 |
| EP | 1609771 A1 * | 12/2005 |
| JP | A-63-051616 | 3/1988 |
| JP | A-03-250612 | 11/1991 |
| JP | A-07-312326 | 11/1995 |
| JP | 2003197457 A * | 7/2003 |
| JP | A-2003-197457 | 7/2003 |

\* cited by examiner

*Primary Examiner*—David Wu
*Assistant Examiner*—Michael M Bernshteyn
(74) *Attorney, Agent, or Firm*—Oliff & Berridge, PLC

(57) ABSTRACT

A release layer paste used for producing a multilayer electronic device, used in combination with an electrode layer paste including terpineol, dehydroterpineol, terpineol acetate, or dehydroterpineol acetate and including a ceramic powder, organic vehicle, plasticizer, and dispersion agent, the organic vehicle containing a binder having polyvinyl acetal as its main ingredient, a ratio (P/B) of the ceramic powder and the binder and plasticizer being controlled to 1.33 to 5.56 (however, excluding 5.56).

2 Claims, 10 Drawing Sheets

POLYVINYL ACETAL
BASED RELEASE LAYER

PVB BASED RELEASE LAYER

STATE OF
INITIAL PRINTING

STATE AFTER
3000 TIMES
PRINTING

RELEASE LAYER PASTE AND METHOD OF PRODUCTION OF A MULTILAYER TYPE ELECTRONIC DEVICE

BACKGROUND OF THE INVENTION

1. Field of the Invention

The present invention relates to release layer paste used for production of a multilayer ceramic-capacitor or other multilayer type electronic device and a method of production of a multilayer type electronic device using the release layer paste.

2. Description of the Related Art

In recent years, due to the increasingly smaller sizes of electronic apparatuses, multilayer ceramic capacitors and other multilayer type electronic devices have become increasingly compact in size and sophisticated in performance. The thicknesses of the interlayer dielectric layers of multilayer type electronic devices (dielectric layers sandwiched between pairs of internal electrodes) have become 1 μm or less—enabling over 800 stacked layers. In the process of production of such electronic devices, the thicknesses of the green sheets able to form-the dielectric layers after firing have become extremely thin (usually 1.5 μm or less), so at the time of formation of the electrode layers by the printing method, the solvent of the electrode layer paste causes the green sheets to dissolve, that is, the so-called "sheet attack" phenomenon becomes a problem. This sheet attack phenomenon leads directly to defects of the green sheets and short-circuit defects, so is a problem which absolutely must be solved for making the layers thinner.

To eliminate this sheet attack, Japanese Patent Publication (A) No. 63-51616, Japanese Patent Publication (A) No. 3-250612, and Japanese Patent Publication (A) No. 7-312326 propose forming an electrode layer paste on a supporting film in a predetermined pattern, then drying it so as to separately prepare a dry electrode layer, then transferring this dry electrode layer to the surface of a green sheet or the surface of a laminate of green sheets so as to transfer the predetermined pattern of the electrode.

However, Japanese Patent Publication (A) No. 63-51616, Japanese Patent Publication (A) No. 3-250612, and Japanese Patent Publication (A) No. 7-312326 had the problem of a difficulty of peeling off the predetermined pattern of the electrode layer from the supporting film.

Therefore, the inventors proposed technology for forming a release layer between a supporting film and a predetermined pattern of an electrode layer so as to improve the peelability of the electrode layer (see Japanese Patent Publication (A) No. 2003-197457).

In Japanese Patent Publication (A) No. 2003-197457, as the release layer paste used for forming the release layer, use was made of one comprised of a binder dissolved in a solvent to form an organic vehicle into which at least a ceramic powder and plasticizer were dissolved. As the binder in the organic vehicle, one the same as the binder contained in the green sheet, that is, polyvinyl butyral (acetal group R=$C_3H_7$), which is a type of polyvinyl acetal-based resin, was used. Further, as the solvent in the organic vehicle contained in the electrode layer paste used for forming the predetermined patterns of electrode layers, terpineol, dehydroterpineol, etc. was used.

However, if using an electrode layer paste using terpineol or dehydroterpineol as a solvent together with a release layer using a butyral resin as a binder, the solvent of the electrode layer paste causes sheet attack at the release layer. Further, at the time of printing the electrode layer paste, the release layer is ablated and residue sometimes generated.

Sheet attack of the release layer becomes a cause of bleedout, shedding, and pinholes at the electrode layer or blank pattern layer formed on the surface of the release layer. Further, the ablation of the release layer causes defects (structural defects) at the time of stacking and in turn can increase the short-circuit defects of the final multilayer type electronic device.

Therefore, prevention of sheet attack and ablation of the release layer has been strongly demanded.

SUMMARY OF THE INVENTION

An object of the present invention is to provide a release layer paste used for producing a multilayer type electronic device which does not cause sheet attack on an electrode layer paste for forming an electrode layer (if necessary, further a blank pattern layer paste for forming a blank pattern layer) and which enables formation of a release layer free of ablation at the time of printing of the paste and a method of production of a multilayer type electronic device using the release layer paste.

To achieve the above object, according to the present invention, there is provided a release layer paste used for producing a multilayer type electronic device, used in combination with an electrode layer paste including terpineol, dehydroterpineol, terpineol acetate, or dehydroterpineol acetate and including a ceramic powder, organic vehicle, plasticizer, and dispersion agent, the organic vehicle containing a binder having polyvinyl acetal as its main ingredient, a ratio (P/B) of the ceramic powder and, the binder and plasticizer being controlled to 1.33 to 5.56 (however, excluding 5.56).

According to the present invention, there is provided a release layer paste used for producing a multilayer type electronic device, used in combination with an electrode layer paste including terpineol, dehydroterpineol, terpineol acetate, or dehydroterpineol acetate and including a ceramic powder, organic vehicle, plasticizer, and dispersion agent, the organic vehicle containing a binder having polyvinyl acetal as its main ingredient, the binder being contained in an amount of 12 to 50 parts by weight with respect to 100 parts by weight of the ceramic powder (however, excluding 12 parts by weight).

Preferably, the electrode layer paste used in combination with further contains at least one solvent selected from the group of kerosine, xylene, octanol, nonanol, decanol, undecanol, benzyl acetate, carbitol, butyl carbitol, and butyl carbitol acetate.

Preferably, the polyvinyl acetal has a polymerization degree of 2000 to 3600 and an acetalization degree of 66 to 74 mol %.

Preferably, the plasticizer is at least one plasticizer selected from the group of dibutyl phthalate (DBP), dioctyl phthalate (DOP), and butylbenzyl phthalate (BBP) and is contained in an amount of 0 to 100 parts by weight (however, excluding 0 part by weight and 100 parts by weight) with respect to 100 parts by weight of the ceramic powder.

Preferably, the ceramic powder has an average particle size of 0.2 μm or less.

Preferably, the dispersion agent is a polyethylene glycol-based dispersion agent and is contained in an amount of 1 to 3 parts by weight with respect to 100 parts by weight of the ceramic powder.

Preferably, the organic vehicle contains a solvent comprised of at least one of ethyl alcohol, methylethylketone, methylisobutylketone, propanol, xylene, and toluene and contained so as to give a concentration of nonvolatile ingredients of 5 to 20 wt %.

According to the present invention, there is provided a method of production of a multilayer type electronic device comprising a step of forming a release layer on a releasing side of a first supporting sheet treated for releasing, a step of forming an electrode layer on the surface of the release layer in a predetermined pattern, a step of forming a green sheet on the surface of the electrode layer to obtain a green sheet having an electrode layer, a step of stacking green sheets having the electrode layers to form a green chip, and a step of firing the green chip, wherein as the release layer paste for forming the release layer, any of the above release layer pastes is used.

Preferably, the method further comprises treating the first supporting sheet for releasing by coating it with a release agent mainly comprised of silicone and controlling a peeling strength of the first supporting sheet to 8 to 20 mN/cm (however, excluding 8 mN/cm). Alternatively, the method further comprises treating the first supporting sheet for releasing by coating it with a release agent mainly comprised of an alkyd resin and controlling a peeling strength of the first supporting sheet to 50 to 130 mN/cm (however, excluding 50 mN/cm and 130 mN/cm).

Preferably, the ceramic powder contained in the release layer paste is the same ceramic powder as contained in the paste for forming the green sheet.

Preferably, a thickness of said release layer is 0.05 to 0.2 μm.

The method may further comprise, before forming the green sheet, forming on the surface of the release layer where the electrode layer is not formed a blank pattern layer to the same thickness as the electrode layer and of the same material as the green sheet.

The method may further comprise, before stacking the green sheets having electrode layers, forming an adhesive layer on the surface of the green sheet having electrode layers opposite to the electrode layer side and stacking the green sheets having electrode layers through the adhesive layers.

The release layer paste of the present invention can for example be used for forming a release layer in a method of production of a multilayer type electronic device having a step of forming a release layer on a release side of a first supporting sheet treated for releasing, a step of forming an electrode layer on the surface of the release layer in a predetermined pattern, a step of forming a green sheet on the surface of the electrode layer to obtain a green sheet having an electrode layer, a step of stacking green sheets having the electrode layer to form a green chip, and a step of firing the green chip.

The release layer paste of the present invention is a paste comprised of a binder in which polyvinyl acetal is contained as a main ingredient. The polyvinyl acetal contained in the paste in the present invention is hard to be dissolved or swelled by (is hardly soluble with) the terpineol, dehydroterpineol, terpineol acetate, or dehydroterpineol acetate contained as a solvent in electrode layer paste or blank pattern layer paste for forming the electrode layer or blank pattern layer. Therefore, there is the effect that the release layer formed using the release layer paste of the present invention is not subject to sheet attack by the electrode layer paste or blank pattern layer paste. As a result, the printability of the electrode layer paste or blank pattern layer paste for forming the electrode layer or blank pattern layer on the release layer formed using the release layer paste of the present invention is stable. Specifically, bleedout, shedding, and pinholes at the electrode layer or blank pattern layer formed on the surface of the release layer can be suppressed. Bleedout, shedding, and pinholes of the electrode layer and blank pattern layer easily occur due to the exposure of the supporting sheet due to dissolution of the release layer, but the release layer formed using the release layer paste of the present invention is not subject to sheet attack by the electrode layer paste or blank pattern layer paste, so the electrode layer or blank pattern layer itself will not crack due to dissolution and even if printed, will not shed residue etc. No bleedout, shedding, and pinholes of the electrode layer and blank pattern layer formed on the surface of the release layer will occur.

Note that the same is true when the electrode layer paste or blank pattern layer paste for forming the electrode layer or blank pattern layer contains as a solvent, in addition to the above terpineol, dehydroterpineol, terpineol acetate, or dehydroterpineol acetate, an aromatic, hydrocarbon, higher alcohol, ester, carbitol, or other solvent together.

Further, the release layer formed using the release layer paste of the present invention is not ablated and does not generate residue at the time of printing of the electrode layer paste or blank pattern layer paste. Therefore, occurrence of defects (structural defects) at the time of stacking is suppressed and short-circuit defects of the finally obtained multilayer ceramic capacitor or other multilayer type electronic device can be reduced.

In the present invention, preferably the peeling strength of the first supporting sheet is controlled to 8 to 20 mN/cm (however, excluding 8 mN/cm) or 50 to 130 mN/cm (however, excluding 50 mN/cm and 130 mN/cm), whereby even if used combined with an electrode layer paste using terpineol, dehydroterpineol, terpineol acetate, or dehydroterpineol acetate as a solvent, the release layer formed using the release layer paste of the present invention will not drop off from the first supporting sheet.

The multilayer electronic device is not particularly limited. A multilayer ceramic capacitor, multilayer piezoelectric device, multilayer chip inductor, multilayer chip varistor, multilayer chip thermistor, multilayer chip resistor, or other surface mounted chip type electronic device (SMD) may be illustrated.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

In the present embodiment, as the multilayer electronic device, a multilayer ceramic capacitor is explained as an example.

Multilayer Ceramic Capacitor

Figure 1:
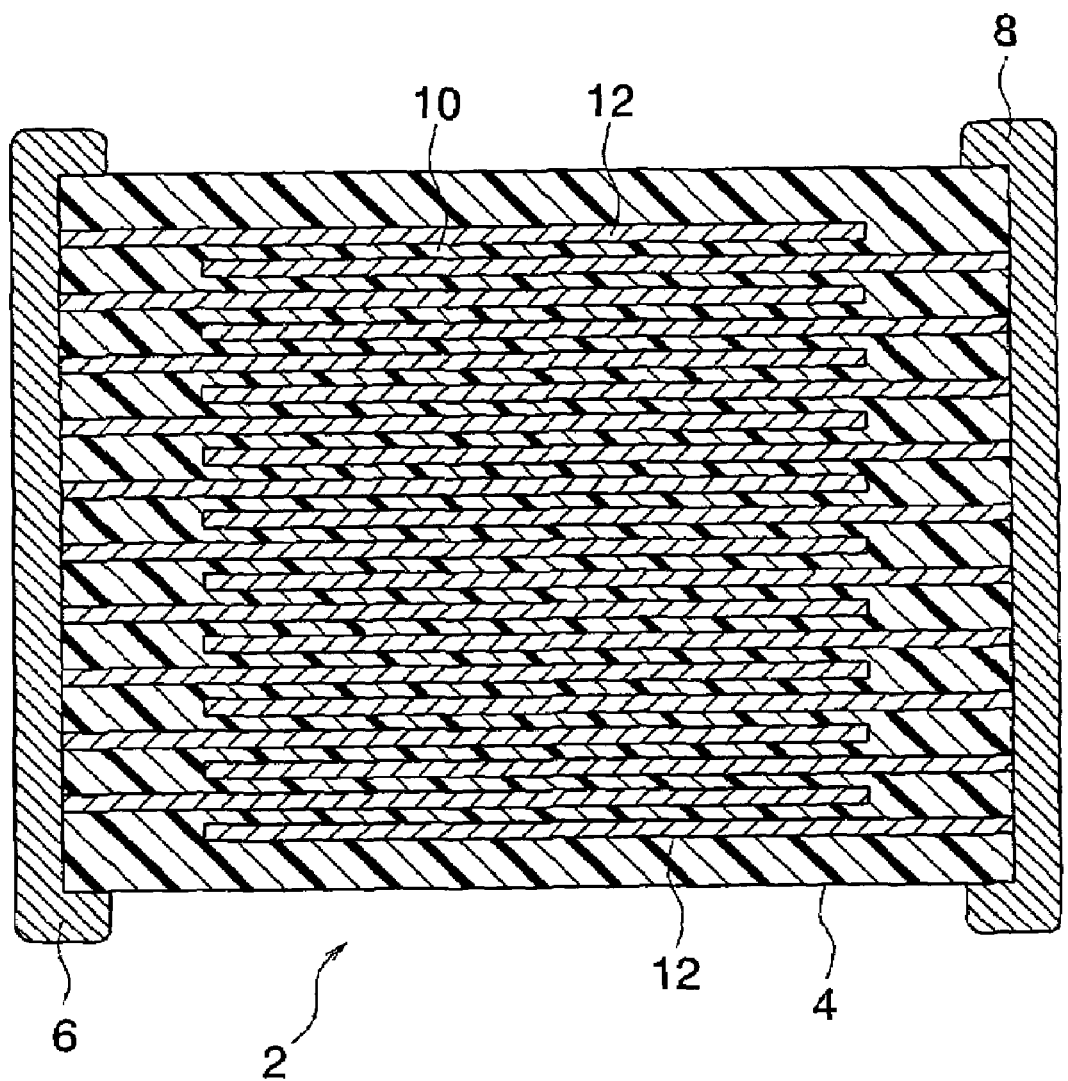
FIG. 1 is a schematic cross-sectional view of a multilayer ceramic capacitor according to an embodiment of the present invention.

As shown in FIG. 1, the multilayer ceramic capacitor 2 according to an embodiment of the present invention has a capacitor body 4 comprised of dielectric layers 10 and internal electrode layers 12 alternately stacked. This capacitor body 4 is formed at its two side ends with a pair of external electrodes 6, 8 connected to the internal electrode layers 12 alternately arranged inside the body 4. The internal electrode layers 12 are stacked so that the side end faces are alternately exposed at the surfaces of the two facing ends of the capacitor body 4. The pair of external electrodes 6, 8 is formed at the two ends of the capacitor body 4 and is connected to the exposed end faces of the alternately arranged internal electrode layers 12 to form a capacitor circuit.

The external shape and dimensions of the capacity body 4 are not particularly limited and can be suitably set in accordance with the application. Usually, the external shape is made a substantially parallelepiped shape and the dimensions are made normally (0.4 to 5.6 mm)×(0.2 to 5.0 mm)×(0.2 to 1.9 mm) or so.

Figure 2A:
FIG. 2A to FIG. 2C are cross-sectional views of principal parts showing a method of formation of an electrode layer and green sheet according to an embodiment of the present invention.
Figure 2B:
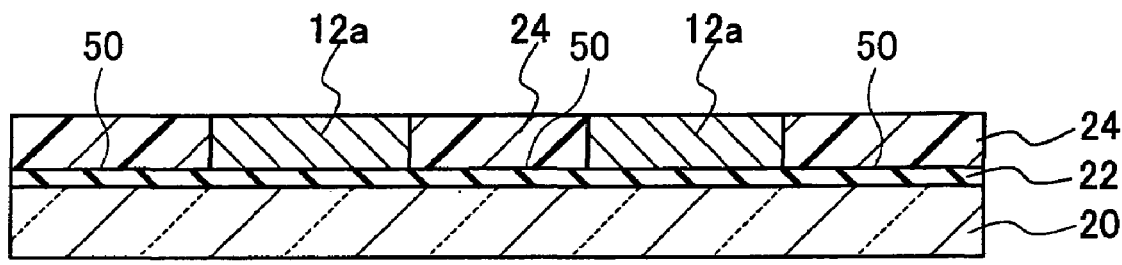
Figure 2C:
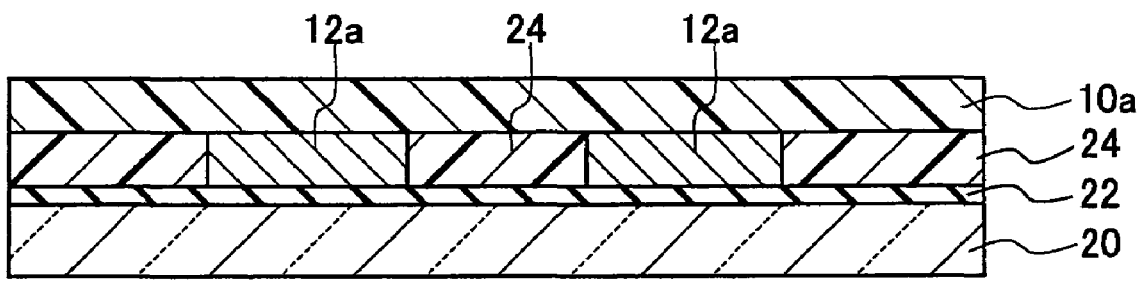

The dielectric layers 10 are formed by firing the green sheets 10a shown in FIG. 2C etc. They are not particularly limited in material. For example, they may be formed by calcium titanate, strontium titanate, and/or barium titanate or another dielectric material. The thickness of each of the dielectric layers 10 is, in the present embodiment, preferably reduced to 5 μm or less, more preferably 3 μm or less.

The internal electrode layers 12 are formed by firing predetermined patterns of electrode layers 12a formed by the electrode layer paste shown in FIG. 2B or FIG. 2C. The thickness of each of the internal electrode layers 12 is preferably reduced to 1.5 μm or less, more preferably 1.0 μm or less.

The material of external electrodes 6, 8 used is usually copper or a copper alloy, nickel or a nickel alloy, etc., but silver or a silver and palladium alloy etc. can also be used. The thickness of the external electrodes 6, 8 is not particularly limited, but usually is 10 to 50 μm or so.

Method of Production of Multilayer Ceramic Capacitor

Next, an example of the method of production of a multilayer ceramic capacitor 2 according to the present embodiment will be explained.

Formation of Release Layer (1) In the present embodiment, first, as shown in FIG. 2A, a carrier sheet 20 is formed with a release layer 22.

As the carrier sheet 20, for example, a PET film etc. is used. To improve it in peelability, it is coated with a release agent mainly comprised of silicone, etc. The peeling strength of the carrier sheet 20 from the later mentioned release layer 22 is preferably controlled to 8 to 20 mN/cm (however, excluding 8 mN/cm), more preferably 10 to 15 mN/cm in range. A release agent mainly comprised of an alkyd resin may also be used for coating. The peeling strength of the carrier sheet 20 from the later mentioned release layer 22 may be controlled preferably to 50 to 130 mN/cm (however, excluding 50 mN/cm and 130 mN/cm), more preferably 60 to 100 mN/cm in range. By controlling the peeling strength to this range, as explained later, even if used together with an electrode layer paste using terpineol, dehydroterpineol, terpineol acetate, or dehydroterpineol acetate as a solvent, the later mentioned release layer 22 will not drop off the carrier sheet 20. The thickness of the carrier sheet 20 is not particularly limited, but preferably is 5 to 100 μm.

The thickness of the release layer 22 is preferably made 0.05 to 0.2 μm, more preferably 0.05 to 0.1 μm or so. If the release layer 22 is too thin, the effect of forming this can no longer be obtained while if the release layer 22 is too thick, the later explained electrode layer 12a (see FIG. 2B) will end up becoming hard to peel off from the carrier sheet 20 and the electrode layer 12a will be liable to be damaged at the time of peeling.

The method of forming the release layer 22 is not particularly limited so long as it allows an extremely thin layer to be uniformly formed, but in the present embodiment, a coating method using a release layer paste (for example, using a wire-bar coater or die coater).

The release layer paste used in the embodiment contains a ceramic powder, organic vehicle, plasticizer, and dispersion agent. Further, usually it also contains a release agent.

As the ceramic powder, one of the same composition as the ceramic powder contained in the later explained green sheet 10a is used. By doing this, even if the ingredients of the release layer 22 react with the green sheet 10a during firing, the composition will not change.

The ceramic powder preferably has an average particle size smaller than the thickness of the release layer 22 after forming and drying the paste. Specifically, it is 0.2 μm or less, more preferably 0.1 μm or less.

If the ceramic powder has too large an average particle size, the release layer 22 becomes hard to be made thin, while if the ceramic powder is too small in particle size, dispersion becomes extremely difficult, so the lower limit is preferably 0.01 μm.

The ceramic powder is contained in the release layer paste in a range so that the nonvolatile concentration becomes 5 to 20 wt %, more preferably 10 to 15 wt %. If the ceramic powder is too small in content, the paste viscosity becomes low and formation of a layer by coating becomes difficult, while if the ceramic powder is too great in content, it becomes difficult to make the coated thickness small.

The organic vehicle contains a binder and a solvent. The binder, in the present embodiment, has polyvinyl acetal (acetal group R=CH$_3$), a type of polyvinyl acetal-based resin, as its main ingredient.

The content of the polyvinyl acetal in the binder is preferably 95 wt % or more, more preferably 100 wt %. As a resin able to be used in combination with polyvinyl acetal, though in a very small amount, there are polyvinyl acetal-based resins other than polyvinyl acetal, an acryl resin, ethyl cellulose, etc.

As a polyvinyl acetal-based resin other than polyvinyl acetal, polyvinyl acetoacetal, polyvinyl butyral (acetal group $R=C_3H_7$), polyvinyl formal (acetal group $R=H$), polyvinyl benzal, polyvinyl phenylacetal, polyvinyl propional, polyvinyl hexanal, etc. may be illustrated.

The polyvinyl acetal used in the embodiment preferably has a polymerization degree of 2000 to 3600, more preferably 2000 to 3000. If the polymerization degree is less than 2000, sheet attack is liable to occur, while if over 3600, the release layer paste becomes higher in viscosity, so the dispersability of the ceramic powder is poor and a homogeneous paste tends to become difficult to obtain.

Further, the polyvinyl acetal used in the embodiment has an amount of residual acetyl groups of normally 3 mol % or less.

Further, the polyvinyl acetal used in the embodiment preferably has an acetalization degree (content of acetal groups) of 66 to 74 mol %.

If the acetalization degree is less than 66 mol %, sheet attack is liable to occur, while if over 74 mol %, production is extremely difficult.

Note that the acetalization degree of the polyvinyl acetal can be calculated by measuring the amount of residual acetyl groups and amount of vinyl alcohol based on the JIS-K6729 "Polyvinyl Formal Test Method" and subtracting the amounts of the two ingredients from 100.

The binder is preferably contained in the release layer paste in an amount, with respect to 100 parts by weight of the ceramic powder, of 12 to 50 parts by weight (however, excluding 12 parts by weight), more preferably 20 to 30 parts by weight. If the amount of the binder is too small, when forming later explained electrode layer 12a and blank pattern layer 24, the release layer 22 dissolves and electrode shedding easily occurs and continuous printing of 500 times or more becomes hard to withstand, while if too large, the peeling of the electrode layer 12a and blank pattern layer 24 becomes difficult. When the content of the binder is 20 to 30 parts by weight with respect to 100 parts by weight of the ceramic powder, sheet attack of the release layer 22 is effectively prevented. As a result, there is no longer any deposition of powder of the release layer on the back side of the printing plate due to sheet attack of the release layer and there is no longer any change in the printing conditions at the time of continuous printing.

Further, the ratio (P/B) of the ceramic powder and, the binder and later explained plasticizer is controlled to 1.33 to 5.56 (however, excluding 5.56), preferably 1.85 to 2.78, by adjusting the amount of binder. If (P/B) is too small, the release layer 22 dissolves when forming the electrode layer 12a and blank pattern layer 24 and electrode shedding easily occurs and continuous printing of 500 times or more can no longer be withstood, while if too large, peeling of the electrode layer 12a and blank pattern layer 24 becomes difficult.

The solvent is not particularly limited, but alcohol, acetone, methylethylketone (MEK), mineral spirits, methylisobutylketone (MIBK), toluene, xylene, ethyl acetate, etc. may be illustrated. Preferably, at least one type of solvent from alcohol, ketones, toluene, xylene, etc., more preferably ethyl alcohol, MEK, MIBK, propanol, xylene, and toluene is used. The solvent is contained so that the concentration of nonvolatile ingredients in the release layer paste is 5 to 20 wt %, more preferably 10 to 15 wt %.

The plasticizer is not particularly limited. Phthalic acid ester, adipic acid, phosphoric acid ester, glycols, etc. may be illustrated. In the present embodiment, preferably dioctyl adipate (DOA), butyl phthalate butyleneglycol (BPBG), didodecyl phthalate (DDP), dibutyl phthalate (DBP), dioctyl phthalate (DOP), butylbenzyl phthalate (BBP), dibutyl sebacate, etc. may be used. Among these, at least one solvent selected from DBP, DOP, and BBP is particularly preferably used. Use of at least one solvent selected from DBP, DOP, and BBP has the merit that the peeling strength becomes lower.

The plasticizer is contained in an amount, with respect to 100 parts by weight of the ceramic powder, of preferably 0 to 100 parts by weight (however, excluding 0 parts by weight and 100 parts by weight), more preferably 20 to 70 parts by weight. The plasticizer controls the Tg of the binder in the organic vehicle. By its addition, the peeling strength of the release layer becomes greater, but the stackability (adherability at time of stacking) is improved. Basically, there is no problem even with zero addition of the plasticizer, but when adding this for improving the stackability, transfer, etc., the upper limit is, with respect to 100 parts by weight of the ceramic powder, preferably 100 parts by weight. This is because the addition of the plasticizer causes the plasticizer to bleed out or causes the release layer to increase in tackiness resulting in sticking to the screen or adhesion to the running system, so continuous printing becomes difficult.

The dispersion agent is not particularly limited, but a polyethylene glycol-based dispersion agent, polycarboxylic acid-based dispersion agent, polyhydric alcohol partial ester-based dispersion agent, ester-based dispersion agent, ether-based dispersion agent, etc. may be illustrated. In addition, there are a block polymer type dispersion agent or a graft polymer type dispersion agent. In the present embodiment, preferably a polyethylene glycol-based dispersion agent is used.

The dispersion agent is contained in an amount, with respect to 100 parts by weight of the ceramic powder, of preferably 1 to 3 parts by weight, more preferably 1.5 to 2.5 parts by weight. The dispersion agent has the effects of improvement of the dispersability of the pigment (ceramic powder) and improvement of the stability of the coating (ageing).

If the content of the dispersion agent is too small, the effect of adding this becomes insufficient, while if too great, the problem of a drop in the dispersability due to micelle formation or recoagulation sometimes arises.

The release agent is not particularly limited, but paraffin, a wax, aliphatic acid esters, silicone oil, etc. may be illustrated. The release agent used here may be the same as or different from the release agent contained in the green sheet 10a.

The release agent is contained in an amount, with respect to 100 parts by weight of the binder in the organic vehicle, of preferably 5 to 20 parts by weight, more preferably 5 to 10 parts by weight.

Further, the release layer paste may further contain an anti-static aid or other additive.

The release layer paste may be formed by mixing the above ingredients by a ball mill etc. to make a slurry.

This release layer paste is coated on the carrier sheet 20, then dried to form the release layer 22. The drying temperature is not particularly limited, but preferably is 50 to 100° C. The drying time is preferably 1 to 10 minutes.

Formation of Electrode Layer (2) Next, as shown in FIG. 2B, the surface of the release layer 22 formed on the carrier sheet 20 is formed with a predetermined pattern of an electrode layer (internal electrode pattern) 12a giving the internal electrode layer 12 shown in FIG. 1 after firing.

The thickness of the electrode layer 12a is preferably 0.1 to 2.0 µm, more preferably 0.1 to 1.0 µm or so. The thickness of the electrode layer 12a is, with the current art, within that range or so, but the thinner the better in the range where electrode breakage does not occur. The electrode layer 12a may be formed by a single layer or be formed by a plurality of layers with two or more different compositions. Further, in the present embodiment, since the release layer 22 is formed with the electrode layer 12a, electrode shedding can be effectively prevented and the electrode layer 12a can be formed well with a high precision.

The method of formation of the electrode layer 12a is not particularly limited so long as it is a method that can form the layer uniformly. For example, screen printing or gravure printing or another thick film forming method using the electrode layer paste or vapor deposition, sputtering, or another thin film method may be mentioned, but in the present embodiment, the case of using the electrode layer paste for the thick film method of screen printing or gravure printing is illustrated.

The electrode layer paste used in the present embodiment contains a conductive powder and an organic vehicle.

The conductive powder is not particularly limited, but preferably is comprised of at least one material selected from Cu, Ni, and their alloys, more preferably is comprised of Ni or an Ni alloy or mixtures of the same.

As the Ni or Ni alloy, an alloy of at least one element selected from Mn, Cr, Co, and Al with Ni is preferable. The Ni content in the alloy is preferably at least 95 wt %. Further, the Ni or Ni alloy may contain P, Fe, Mg, or other various trace ingredients up to 0.1 wt % or so or less.

This conductive powder is not particularly limited in shape and may be spherical, flake shaped, etc. and may be a mixture of these shapes. Further, the particle size of the conductive powder is, in the case of spheres, usually 0.1 to 2 μm, preferably 0.2 to 1 μm or so.

The conductive powder is contained in the electrode layer paste in an amount of preferably 30 to 70 wt %, more preferably 40 to 50 wt %.

The organic vehicle contains a binder and a solvent. The binder is not particularly limited, but ethyl cellulose, acryl resin, polyvinyl butyral, polyvinyl acetal, polyvinyl alcohol, polyolefin, polyurethane, polystyrene, or copolymers of the same etc. may be illustrated. In the present embodiment, in particular, polyvinyl butyral is used. The binder is contained in the electrode layer paste in an amount, with respect to 100 parts by weight of the conductive powder, of preferably 8 to 20 parts by weight.

The solvent is not particularly limited, but terpineol, butyl carbitol, kerosine, acetone, isobornyl acetate, etc. may be illustrated. In the present embodiment, in particular, terpineol, dehydroterpineol, terpineol acetate, or dehydroterpineol acetate (below, these solvents being suitably referred to as "terpineol derivatives") are used. These solvents may be used alone or in mixtures of two or more types. The solvent is contained in the electrode layer paste in an amount of preferably 20 to 65 wt %, more preferably 30 to 50 wt %.

In the present embodiment, as the solvent, in addition to the above-mentioned terpineol derivatives, aromatics, hydrocarbons, higher alcohols, esters, carbitols, or other solvents may be contained. As these solvents, specifically, kerosine, xylene, octanol, nonanol, decanol, undecanol, benzyl acetate, carbitol, butyl carbitol, and butyl carbitol acetate (below, these solvents being suitably referred to as "other solvents") may be mentioned. These solvents may be used alone or in mixtures of two or more types.

The electrode layer paste used in the embodiment includes any of the above terpineol derivatives as essential ingredients and in accordance with need may have any of the other solvents added to it, but when using a terpineol derivative and other solvent together, the ratio of the terpineol derivative and other solvent is preferably terpineol derivative:other solvent=100:50 to 50:50 (weight ratio). If the content of the terpineol derivative is less than 50 wt %, formation of the coating when preparing the electrode layer paste tends to become difficult. Note that the total content of the terpineol derivative and other solvent when using another solvent is made the above range.

The electrode layer paste, in the same way as the above release layer paste, may contain as a co-material a ceramic powder of the same composition as the ceramic powder contained in the later explained green sheet 10a. The co-material has the effect of suppressing sintering of the conductive powder in the firing process. The ceramic powder used as the co-material is contained in the electrode layer paste in an amount, with respect to 100 parts by weight of the conductive powder, of preferably 5 to 25 parts by weight.

The electrode layer paste preferably contains, for the purpose of improving the adherability with the green sheet, a plasticizer or tackifier. As the plasticizer, a phthalic acid ester, adipic acid, phosphoric acid ester, glycols, etc. may be illustrated. The plasticizer is contained in an amount, with respect to 100 parts by weight of the binder in the organic vehicle, of preferably 10 to 300 parts by weight. If the content of the plasticizer is too small, there is no effect of addition, while if too great, the electrode layer 12a formed seriously falls in strength and, further, excess plasticizer tends to bleed out from the electrode layer 12a.

The electrode layer paste can be formed by kneading the above ingredients by a ball mill etc. to form a slurry.

Formation of Blank Pattern Layer (3) In the present embodiment, after or before the surface of the release layer 22 is formed with a predetermined pattern of an electrode layer 12a by the printing method, the clearances on the surface of the release layer 22 where the electrode layer 12a is not formed shown in FIG. 2B (blank pattern parts 50) are formed with a blank pattern layer 24 of the same thickness as the electrode layer 12a. The thickness of the blank pattern layer 24 is made the same as the thickness of the electrode layer 12a since a step difference will arise if they are not substantially the same.

The blank pattern layer 24 is comprised of the same material as the later explained green sheet 10a. Further, the blank pattern layer 24 can be formed by the same method as with the electrode layer 12a or the later mentioned green sheet 10a (using blank pattern layer paste).

This blank pattern layer paste is coated at the blank pattern parts 50 between the electrode layers 12a. After this, the electrode layer 12a and blank pattern layer 24 are dried if necessary. The drying temperature is not particularly limited, but preferably is 70 to 120° C., while the drying time is preferably 5 to 15 minutes.

Formation of Green Sheet (4) Next, as shown in FIG. 2C, the surfaces of the electrode layer 12a and blank pattern layer 24 are formed with a green sheet 10a forming the dielectric layer 10 shown in FIG. 1 after firing.

The green sheet 10a has a thickness of preferably 0.5 to 30 μm, more preferably 0.5 to 10 μm or so.

The method of formation of the green sheet 10a is not particularly limited so long as it is a method able to form the layer uniformly, but in the present embodiment, the case of use of a dielectric paste and use of the doctor blade method is illustrated.

The dielectric paste used in the present embodiment usually is comprised of an organic solvent-based paste obtained by kneading a ceramic powder and organic vehicle.

As the ceramic powder, it is possible to suitably select and mix ones from complex oxides or various compounds forming oxides, for example, carbonates, nitrates, hydroxides, and organometallic compounds etc. The ceramic powder usually is used as a powder having an average particle size of 0.4 µm or less, preferably 0.1 to 3.0 µm or so. Further, to form an extremely thin ceramic green sheet, it is preferable to use powder finer than the thickness of the ceramic green sheet.

The organic vehicle contains a binder and a solvent. The binder is not particularly limited, but ethyl cellulose, polyvinyl butyral, acryl resin, or another usual binder may be illustrated. The solvent is not particularly limited, but terpineol, alcohol, butyl carbitol, acetone, methylethylketone (MEK), toluene, xylene, ethyl acetate, butyl stearate, isobornyl acetate, or another usual organic solvent may be illustrated.

The each ingredients in the dielectric paste are not particularly limited in content. The usual contents, for example, for a binder, 1 to 5 wt % or so, while for a solvent (or water), 10 to 50 wt % or so is suitable.

The dielectric paste may contain, in accordance with need, additives selected from various dispersion agents, plasticizers, dielectrics, subcomponent compounds, glass frit, insulators, etc. When adding these additives to the dielectric paste, the total content is preferably made about 10 wt % or less.

As the plasticizer, dioctyl phthalate, benzylbutyl phthalate, or other phthalic acid esters, adipic acid, phosphoric acid esters, glycols, etc. may be illustrated. The plasticizer when using a butyral resin as the binder preferably is contained in an amount, with respect to 100 parts by weight of the binder resin, of 25 to 100 parts by weight. If the amount of plasticizer is too small, the green sheet tends to become brittle, while if too great, the plasticizer bleeds out and handling is difficult.

The above dielectric paste is used to form a green sheet 10*a* on the surfaces of the electrode layer 12*a* and blank pattern layer 24 by the doctor blade method.

Figure 3A:
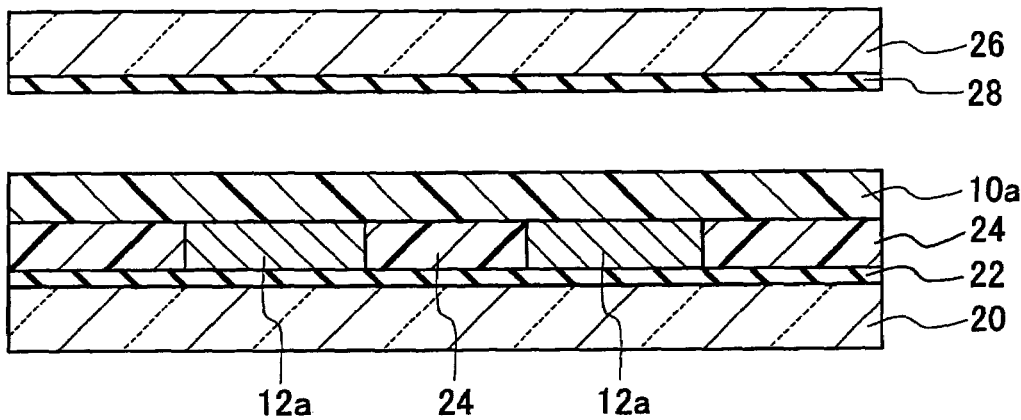
FIG. 3A to FIG. 3C are cross-sectional views of principal parts showing a method of formation of a bonding layer according to an embodiment of the present invention.

Formation of Adhesive Layer (5) In the present embodiment, next, separate from the above carrier sheet 20, as shown in FIG. 3A, a second supporting sheet constituted by a carrier sheet 26 may be formed on its surface with an adhesive layer 28 to prepare an adhesive layer transfer sheet.

The carrier sheet 26 may be comprised of a sheet of the same material as the carrier sheet 20. The thickness of the adhesive layer 28 is preferably 0.3 µm or less and further is preferably thinner than the average particle size of the ceramic powder contained in the green sheet 10*a*.

The method of forming the adhesive layer 28 on the surface of the carrier sheet 26 is not particularly limited so long as it is a method enabling the layer to be formed uniformly, but in the present embodiment, a method using an adhesive layer paste, for example, the bar coater method, die coater method, reverse coater method, dip coater method, kiss coater method, or other method is used.

The adhesive layer paste used in the present embodiments contains an organic vehicle and a plasticizer.

The organic vehicle contains a binder and solvent. The binder may be the same as or different from the binder contained in the green sheet 10*a*. The solvent is not particularly limited. As explained above, the usual organic solvents may be used.

The plasticizer is not particularly limited, but a phthalic acid ester, adipic acid, phosphoric acid ester, glycols, etc. may be illustrated.

The adhesive layer paste may contain ceramic powder of the same composition as the ceramic powder contained in the green sheet 10*a* and may further contain an imidazoline-based anti-static agent or other anti-static agent.

The adhesive layer paste may be formed by kneading the above ingredients by a ball mill etc. to be a slurry.

This adhesive layer paste is coated on the surface of the second supporting sheet constituted by the carrier sheet 26 by the above various coating methods, then the adhesive layer 28 is dried when necessary.

Figure 3B:
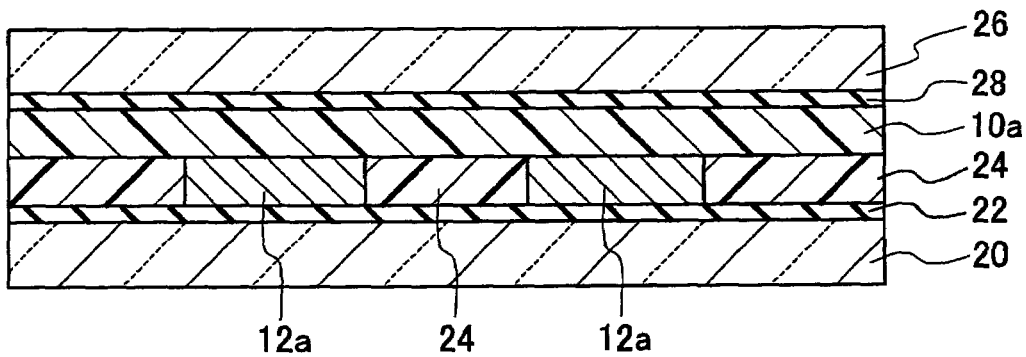
Figure 3C:
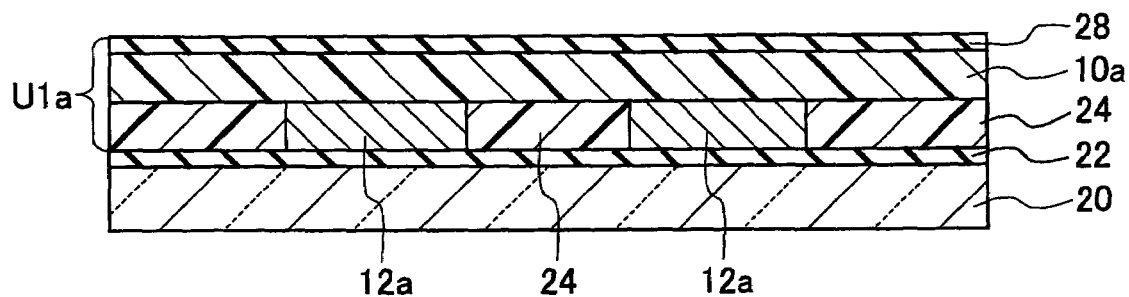

Formation of Laminate Units (6) Next, the green sheet 10*a* formed with the electrode layer 12*a* and blank pattern layer 24 shown in FIG. 2C is formed on its surface with an adhesive layer 28 to obtain a laminate unit U1*a* shown in FIG. 3C.

In the present embodiment, the transfer method is employed as the method of formation of the adhesive layer 28. That is, as shown in FIG. 3A and FIG. 3B, the adhesive layer 28 of the adhesive layer transfer sheet prepared in the above way is pressed against the surface of the green sheet 10*a* and hot pressed, then the carrier sheet 26 is peeled off so as to thereby, as shown in FIG. 3C, transfer the adhesive layer 28 to the surface of the green sheet 10*a* and obtain the laminate unit U1*a*.

By forming the adhesive layer 28 by the transfer method, it is possible to effectively prevent the ingredients of the adhesive layer from bleeding out to the green sheet 10*a* or electrode layer 12*a* or blank pattern layer 24. Therefore, the composition of the green sheet 10*a* or electrode layer 12*a* or blank pattern layer 24 is not liable to be adversely affected. Further, even when forming the adhesive layer 28 thin, since the ingredients of the adhesive layer will not bleed out to the green sheet 10*a* or electrode layer 12*a* or blank pattern layer 24, the adherability can be kept high.

The heating temperature at the time of transfer is preferably 40 to 100° C. Further, the pressing strength is preferably 0.2 to 15 MPa. The pressing operation may be pressing by a press or pressing by calendar rolls, but pressing by a pair of rolls is preferable.

Formation of Green Chip (7) Next, a plurality of the obtained laminate units U1*a* is stacked to form a green chip.

In the present embodiment, the laminate units U1*a* are stacked, as shown in FIG. 4A, FIG. 4B and FIG. 5A, FIG. 5B, by adhering each laminate units through the adhesive layers 28. Below, the method of stacking will be explained.

Figure 4A:
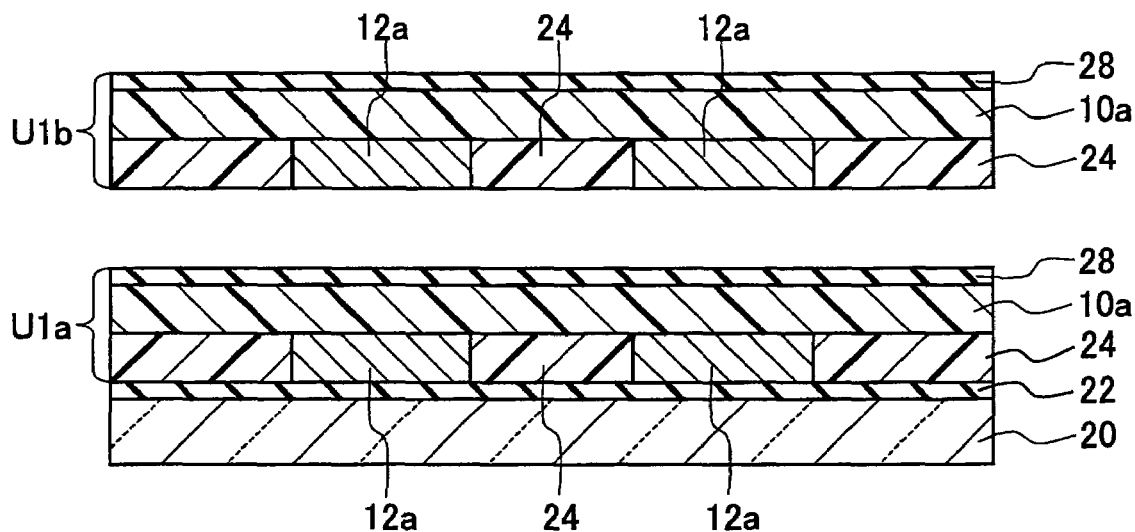
FIG. 4A, FIG. 4B, FIG. 5A, and FIG. 5B are cross-sectional views of principal parts showing a method of stacking green sheets having electrode layers according to an embodiment of the present invention.

First, as shown in FIG. 4A, the above prepared laminate units U1*a* and other laminate units U1*b* prepared by the same method as the laminate unit U1*a* are prepared.

Next, the carrier sheet 20 is peeled off a laminate unit U1*b* to be a state where the laminate unit U1*b* has the carrier sheet 20 peeled off. In the present embodiment, the laminate unit U1*b* is formed on the carrier sheet 20 via the release layer 22, so the carrier sheet 20 can be easily and excellently peeled off the laminate unit U1*b*. Further, at the time of peeling, the electrode layer 12*a* and the blank pattern layer 24 will not be damaged. Further, the release layer 22 is preferably peeled off from the laminate unit U1*b* together with the carrier sheet 20, but may remain on the laminate unit U1*b* side without problem so long as to a small extent. In this case as well, the remaining release layer 22 is sufficiently thin compared with the green sheet 10*a* and the electrode layer 12*a*. Further, the dielectric substance contained in the release layer 22 forms part of the dielectric layer 10 after firing in the same way as the green sheet 10*a*, so does not become a problem.

Figure 4B:
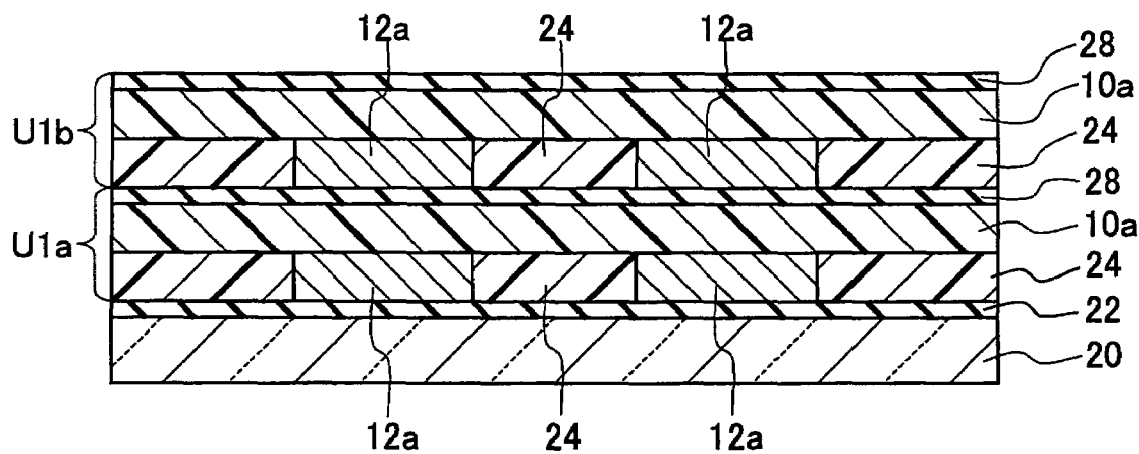

Next, as shown in FIG. 4B, the laminate unit U1b from which the carrier sheet 20 has been peeled off and the laminate unit U1a are adhered and stacked via the adhesive layer 28 of the laminate unit U1a.

Figure 5A:
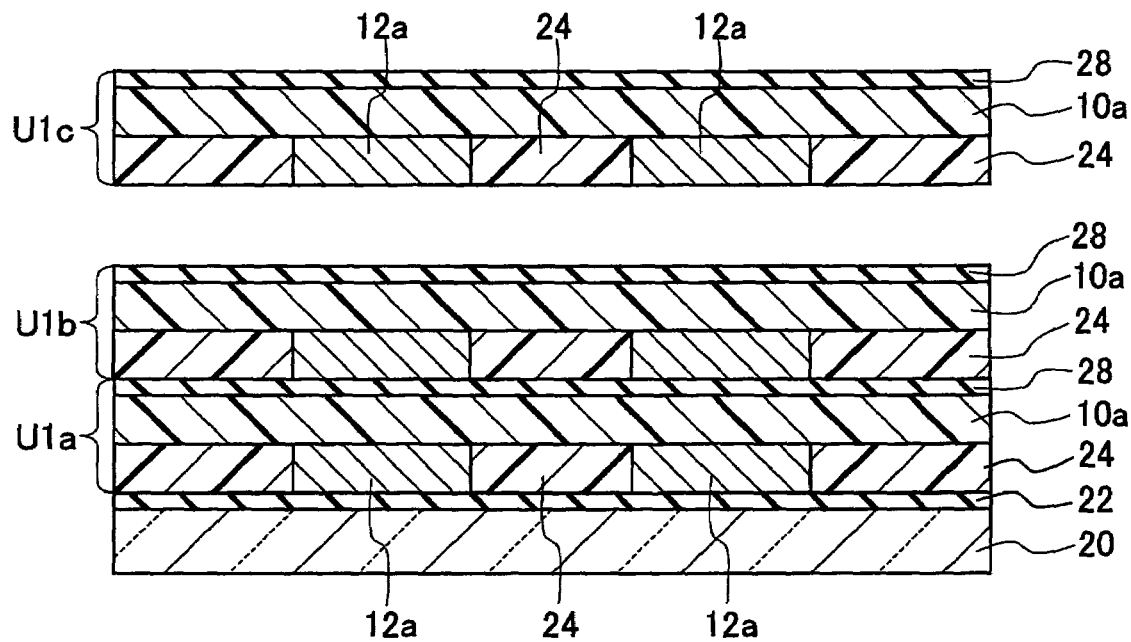
Figure 5B:
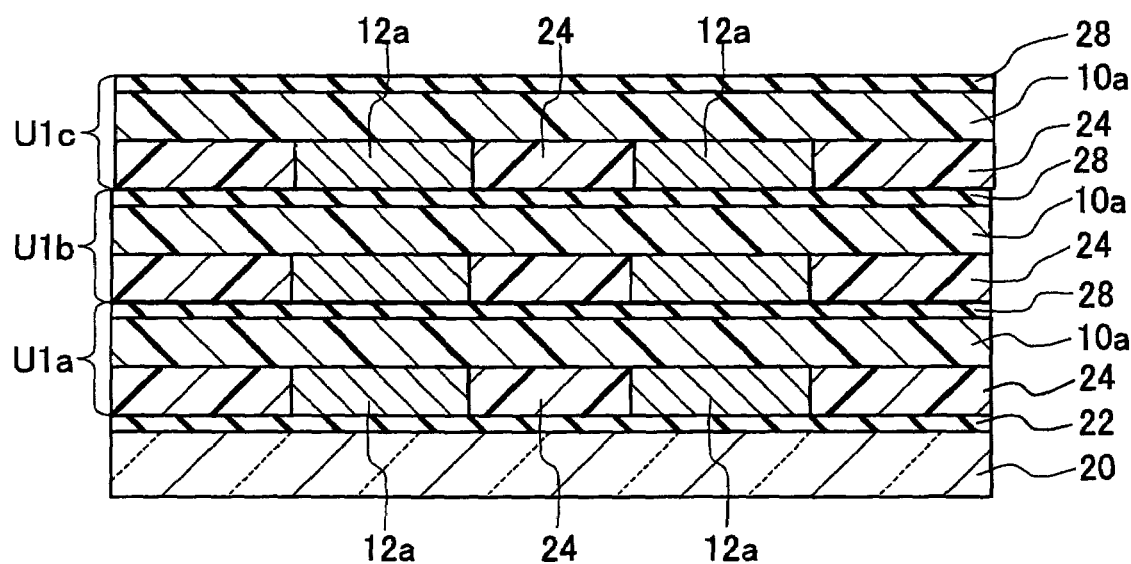

Next, as shown in FIG. 5A and FIG. 5B, in the same way, another laminate unit U1c is adhered and stacked on the laminate unit U1b via the adhesive layer 28 of the laminate unit U1b. The steps shown in FIG. 5A and FIG. 5B are repeated to stack a plurality of laminate units.

Finally, an external layer green sheet is stacked on the top surface and/or bottom surface of this laminate and a final pressing operation performed, then the laminate is cut into a predetermined size to form a green chip. Further, the pressure at the time of the final pressing operation is preferably made 10 to 200 MPa, while the heating temperature is preferably made 40 to 100° C.

Firing of Green Chip etc.

(8) The obtained green chip is treated to remove the binder, fired, and, as needed, heat treated to cause the dielectric layer to reoxidize. Further, the capacitor body 4 comprised of the formed sintered body is printed or transferred with an external electrode paste and fired to form the external electrodes 6, 8 and produce a multilayer ceramic capacitor 2. The produced multilayer ceramic capacitor 2 is mounted on a printed circuit board by soldering etc. and used for various types of electronic apparatuses etc.

The release layer paste of the present embodiment is a paste comprised of a binder in which polyvinyl acetal is included as a main ingredient. In the present embodiment, the polyvinyl acetal included in the paste is hard to be dissolved or swelled by (is hardly soluble with) the terpineol, dehydroterpineol, terpineol acetate, or dehydroterpineol acetate (terpineol derivatives) contained as a solvent in electrode layer paste or blank pattern layer paste for forming the electrode layer 12a or blank pattern layer 24. Therefore, the release layer 22 formed using the release layer paste of the present embodiment is not subject to sheet attack by the electrode layer paste or blank pattern layer paste. As a result, the printability of the electrode layer paste or blank pattern layer paste for forming the electrode layer 12a or blank pattern layer 24 on the release layer 22 formed using the release layer paste of the present embodiment is stable. Specifically, bleedout, shedding, and pinholes at the electrode layer 12a or blank pattern layer 24 formed on the surface of the release layer 22 can be suppressed. Further, the electrode layer 12a or blank pattern layer 24 itself will not crack due to dissolution and even if printed, will not shed residue etc. Note that the same is true when the electrode layer paste or blank pattern layer paste for forming the electrode layer 12a or blank pattern layer 24 contains as a solvent, in addition to the above terpineol derivative, an aromatic, hydrocarbon, higher alcohol, ester, carbitol, or other solvent.

Further, the release layer 22 formed using the release layer paste of the present embodiment will not be ablated to generate residue at the time of printing the electrode layer paste or blank pattern layer paste. Therefore, defects (structural defects) at the time of stacking can be suppressed and the finally obtained multilayer ceramic capacitor 2 can be reduced in short-circuit defects.

Above, an embodiment of the present invention was explained, but the present invention is not limited to the above embodiment in any way and can be modified in various ways within the scope of the gist of the present invention.

For example, the method of the present invention is not limited to the method of production of a multilayer ceramic capacitor and can also be applied as a method of production of another multilayer type electronic device.

The method of formation of the adhesive layer 28 is not limited to the transfer method. Rather than coating the adhesive layer paste on the surface of the second supporting sheet constituted by the carrier sheet 26, it is also possible to directly coat it on the green sheet 10a and then dry it to form the adhesive layer 28.

Figure 6A:
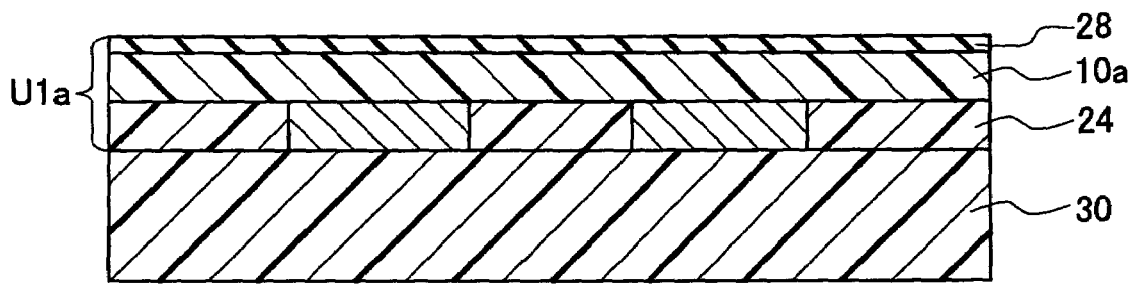
FIG. 6A and FIG. 6B are cross-sectional views of principal parts showing a method of stacking green sheets having electrode layers according to another embodiment of the present invention.
Figure 6B:
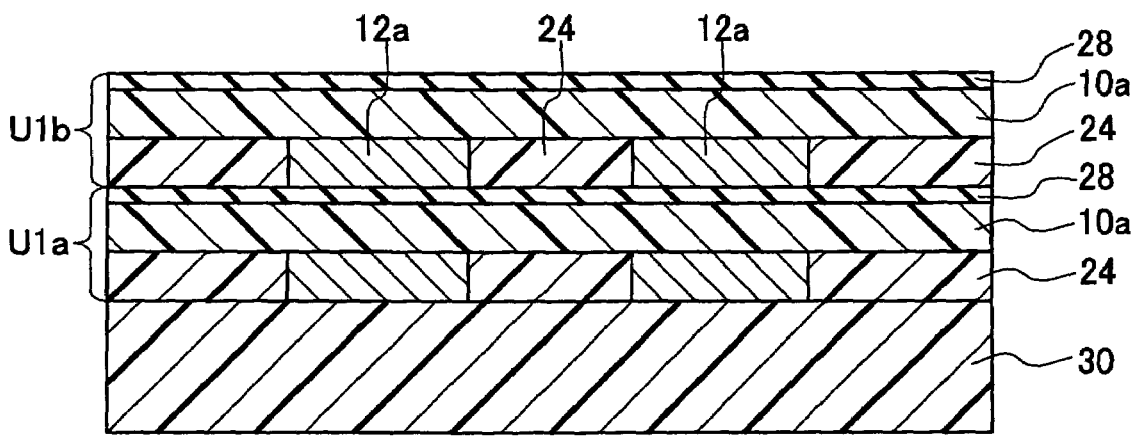

The method of stacking the laminate units, as shown in FIG. 6, may also comprise peeling off the carrier sheets 20 from the laminate units U1a in advance and then stacking the laminate units U1a on an external layer green sheet 30 (thick stack comprised of plurality of stacked green sheets on which electrode layers are not formed).

Figure 7A:
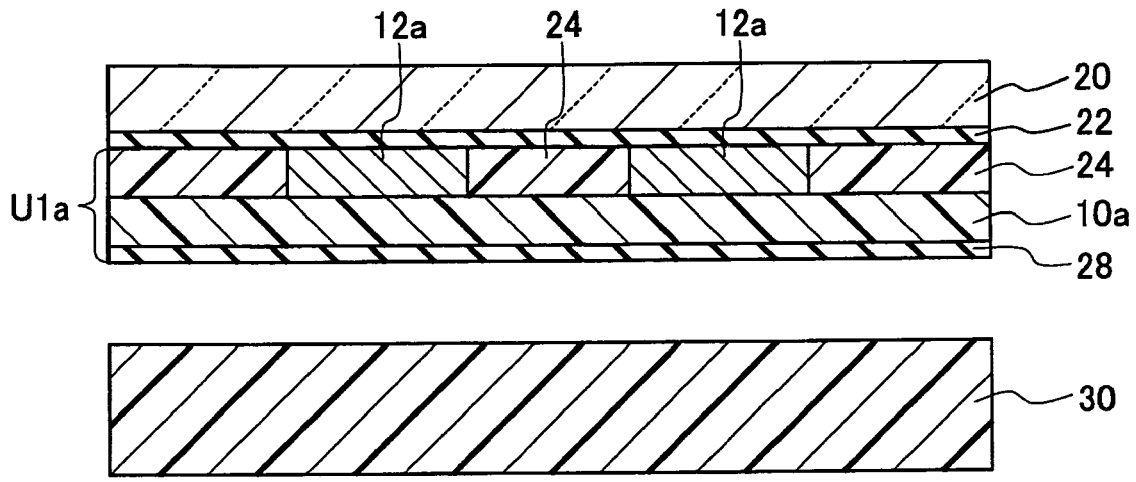
FIG. 7A to FIG. 7C and FIG. 8A to FIG. 8C are cross-sectional views of principal parts showing a method of stacking green sheets having electrode layers according to another embodiment of the present invention.
Figure 7B:
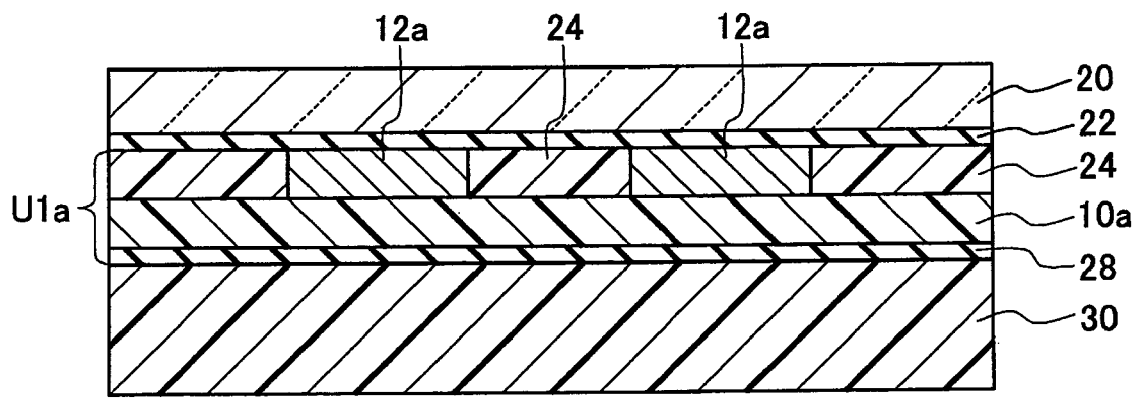
Figure 7C:
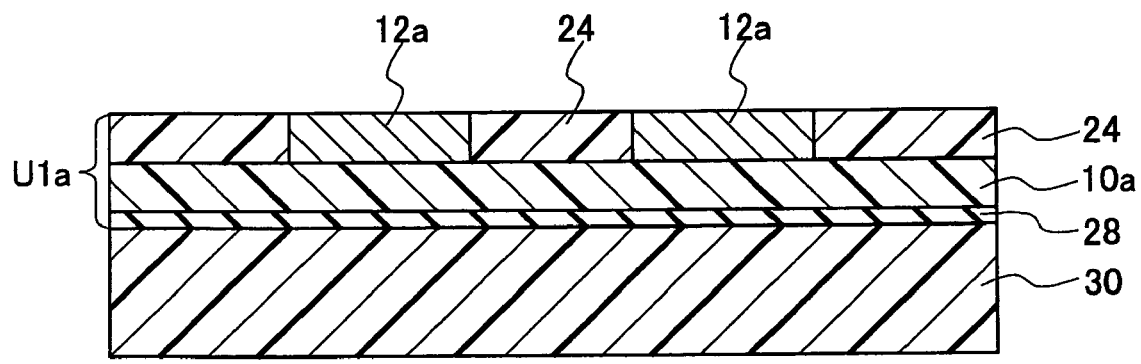
Figure 8A:
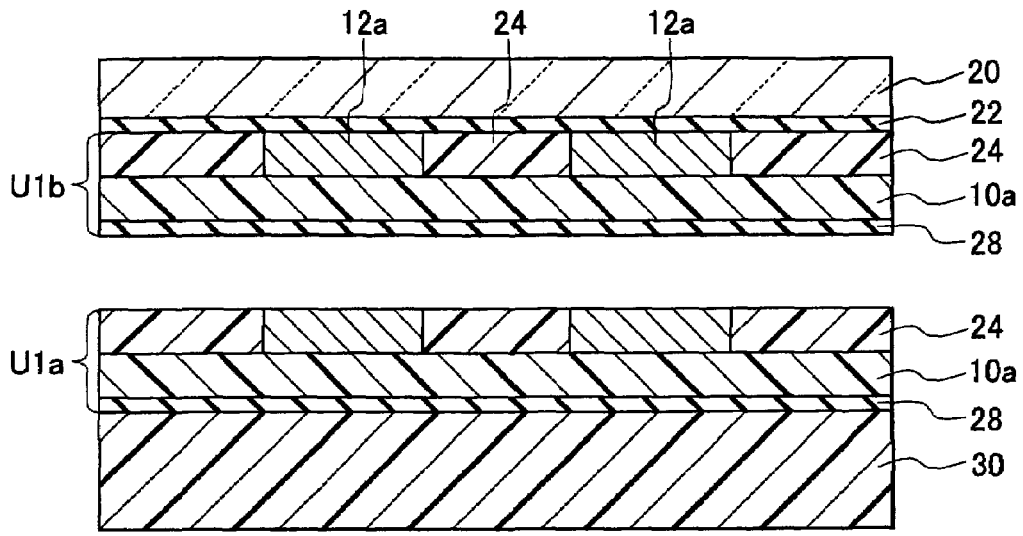
Figure 8B:
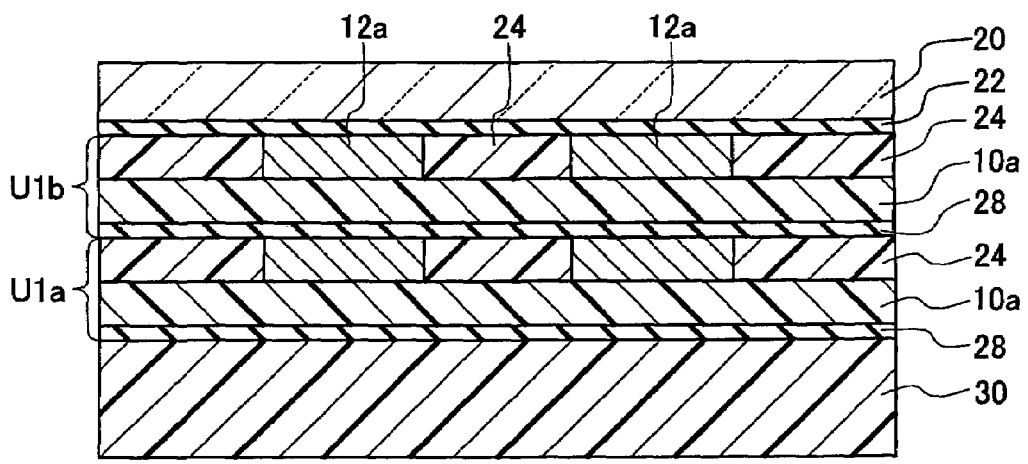
Figure 8C:
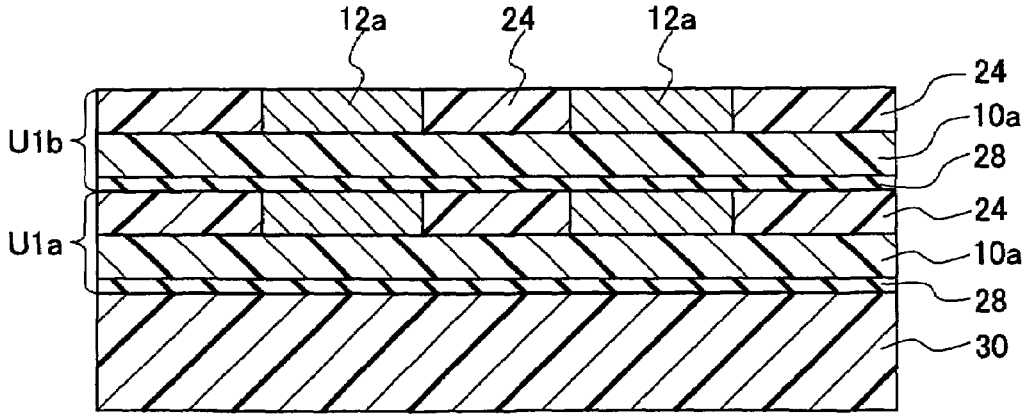

Further, the method of stacking the laminate units, for example as shown in FIG. 7 and FIG. 8, may also comprise stacking each laminate unit, then peeling off the carrier sheet 20. That is, as shown in FIG. 7A, FIG. 7B, first, the external layer green sheet 30 is overlaid with a laminate unit U1a from which the carrier sheet 20 has not been peeled off and is adhered and stacked with it through the adhesive layer 28. Next, as shown in FIG. 7C, the carrier sheet 20 is peeled off the laminate unit U1a. Next, as shown in FIG. 8A to FIG. 8C, the same procedure is used to adhere and stack on the laminate unit U1a another laminate unit U1b through the adhesive layer 28 of the laminate unit U1b. The process shown in FIG. 8A to FIG. 8C is then repeated to stack a plurality of laminate units. Next, the top of the stack is covered with another external layer green sheet and finally pressed. After this, the stack may be cut to a predetermined size to form a green chip. Further, when employing the process shown in FIG. 7 and FIG. 8, it is possible to make the adhering strength of the adhesive layer 28 stronger than the tackiness of the release layer 22 so as to selectively and easily peel off the carrier sheet 20, so this is particularly effective.

EXAMPLES

Below, the present invention will be explained further based on detailed examples, but the present invention is not limited to these examples.

Example 1

Preparation of Release Layer Paste

Preparation of Additive Slurry

First, as the additive (subcomponent) materials, (Ba, Ca)SiO$_3$ in an amount of 1.48 parts by weight, Y$_2$O$_3$ in 1.01 parts by weight, MgCO$_3$ in 0.72 part by weight, MnO in 0.13 part by weight, and V$_2$O$_5$ in 0.045 part by weight were prepared. Next, the prepared additive (subcomponent) materials were mixed to obtain the additive (subcomponent) material mixture.

Next, the additive material mixture in an amount of 8.75 parts by weight was mixed and pulverized with ethyl alcohol in 6.21 parts by weight, n-propanol in 6.21 parts by weight, xylene in 2.19 parts by weight, and a polyethylene glycol-based dispersion agent in 0.09 part by weight using a ball mill to obtain an additive slurry. The mixing and pulverization were performed using a 250 cc polyethylene resin vessel charged with 450 g of 2 mmφ ZrO$_2$ media at a peripheral speed of 45 m/min for 20 hours. The pulverized additive material had a particle size of a median size of about 0.1 μm.

Preparation of Primary Slurry

Next, the entire amount of the obtained additive slurry, BaTiO$_3$ powder of an average particle size of 0.1 μm (BT-01/Sakai Chemical Industry) in an amount of 200 parts by weight, ethyl alcohol in 42.40 parts by weight, n-propanol in 42.40 parts by weight, xylene in 44.77 parts by weight, a plasticizer constituted by dioctyl phthalate (DOP) in 3.13 parts by weight, a mineral spirits in 14.61 parts by weight, and a polyethylene glycol-based dispersion agent in 2.0 parts by weight were mixed and pulverized using a ball mill. The mixing and pulverization were conducted using a 1 liter polyethylene resin vessel charged with 18 g of 2 mm$\phi$ $ZrO_2$ media at a peripheral speed of 45 m/min for 4 hours.

After this (after mixing for 4 hours), a binder lacquer A prepared by dissolving polyvinyl acetal by ethyl alcohol:n-propanol=1:1 and including the polyvinyl acetal in a resin solids concentration of 7% was additionally added in an amount of 85.7 parts by weight and the result further mixed for 16 hours by a ball mill to obtain a primary slurry.

The polyvinyl acetal used was one having a polymerization degree of 2400, an acetalization degree of 66 mol %, and an amount of residual acetyl groups of 3 mol %. The 85.7 parts by weight of the amount of the binder lacquer A added is the amount by which the amount of addition of the polyvinyl acetal itself becomes 6 wt % with respect to the ceramic powder. The obtained primary slurry had a concentration of nonvolatile ingredients of 40.28%.

Note that, in this example, the above the $BaTiO_3$ powder and the additive material mixture were used as the ceramic powder (average particle size 0.1 μm).

Dilution of Primary Slurry

In this example, a high pressure dispersed and low concentration slurry is difficult to produce by a single process, so first a relatively high concentration primary slurry is produced, then this primary slurry is diluted to produce the release layer paste.

Specifically, the entire amount of the obtained primary slurry is mixed with the following prepared binder lacquer B using a ball mill to give a total amount of addition of the polyvinyl acetal 24 parts by weight and a concentration of nonvolatile ingredients of 10%. The mixing was performed using a 10 liter polyethylene resin vessel charged with 18 g of 2 mm$\phi$ $ZrO_2$ media at a peripheral speed of 45 m/min for 4 hours.

The binder lacquer B was prepared by preparing and mixing ethyl alcohol in an amount of 710.3 parts by weight, n-propanol in 710.3 parts by weight, xylene in 250.7 parts by weight, a plasticizer constituted by dioctyl phthalate (DOP) in 21.92 parts by weight, and the binder lacquer A used for production of the primary slurry in 43.84 parts by weight.

The mixed slurry had a concentration of nonvolatile ingredients of 10%, an amount of polyvinyl acetal with respect to 100 parts by weight of the ceramic powder of 24 parts by weight, a content of the plasticizer with respect to 100 parts by weight of the polyvinyl acetal of 50 parts by weight (12 parts by weight with respect to 100 parts by weight of the ceramic powder), and a ratio (P/B) of the ceramic powder and, the polyvinyl acetal and plasticizer of 2.78 (Table 1, Sample 3).

High Pressure Dispersion Treatment

The obtained mixed slurry was treated using a wet jet mill (Sugino Machine HJP-25005) so as to prepare a release layer paste. The treatment conditions were a pressure of 100 MPa. The treatment was performed once.

Formation of Release Layer

The prepared release layer paste was coated by a bar coater (#2) at a coating rate of 4/min on the surface of a 38 μm thick PET film (first supporting sheet) treated for release (peeling strength: 10.5 mN/cm) by coating its surface with a release agent mainly comprised of silicone, then was dried in a drying oven with an oven temperature of 60° C. for 1 minute so as to form a release layer with a dry thickness of 0.1 μm.

Evaluation of Release Layer

Sheet Attack

The release layer was evaluated for sheet attack by printing the electrode layer paste and blank pattern layer paste used for evaluation of the printability below on the surface of the release layer so as to form an electrode layer and blank pattern layer, then examining the surface of the release layer opposite to the electrode layer and blank pattern layer (surface contacting PET film) by using microscope and checking for the degree of dissolution of the release layer by the degree of deformation and color. The case where no dissolution of the release layer could be confirmed was judged as "G (good)" and the case where it could be confirmed as "P (poor)".

As a result, no dissolution of the release layer could be confirmed, the state was "G (good)".

Printability

The printability was evaluated by printing the surface of a release layer with electrode layer paste and blank pattern layer paste and visually examining the electrode layer and blank pattern layer formed on the surface of the release layer for bleedout, shedding, and pinholes.

Specifically, first, the surface of the release layer was printed with an Ni electrode paste (electrode layer paste) comprised of a binder constituted by polyvinyl butyral (PVB) and a solvent constituted by terpineol by a screen printing machine to give an amount of deposition of Ni metal of 0.55 mg/cm$^2$, then was dried at 90° C. for 2 minutes to form a 1 μm thick predetermined pattern of an electrode layer 12a. Next, the parts of the surface of the release layer on which the electrode layer 12a was not formed was printed by a $BaTiO_3$ paste (blank pattern layer paste) comprised of a binder constituted by polyvinyl butyral (PVB) and a solvent constituted by terpineol by a screen printing machine to give an amount of deposition of $BaTiO_3$ of 0.43 mg/cm$^2$, then was dried at 90° C. for 2 minutes to form a blank pattern. The blank pattern was printed using a screen printing plate with a pattern complementary to the pattern used when printing the electrode layer paste. The blank pattern was formed to have a dry thickness the same as the thickness of the electrode layer. After this, the electrode layer and blank pattern layer formed on the surface of the release layer were visually examined for bleedout, shedding, and pinholes. The case where no bleedout, shedding, and pinholes of the electrode layer and blank pattern layer could be observed was judged as "G (good)" and the case where one or more of the same could be confirmed as "P (poor)".

As a result, no bleedout, shedding, and pinholes of the electrode layer and blank pattern layer could be confirmed, the result was "G (good)".

Sheet Residue

The sheet residue was evaluated by printing the electrode layer paste and blank pattern layer paste used for the evaluation of the printability on the surface of the release layer and visually examining if the release layer was ablated and residue was generated. The case where no residue of the release layer could be confirmed was judged as "G (good)", while the case where residue could be confirmed was judged as "P (poor)".

As a result, no residue of the release layer could be confirmed, the result was "G (good)".

Fluctuation in Amount of Deposition of Electrode Layer Paste (Electrode Printing State)

The fluctuation in the amount of deposition of the electrode layer paste was evaluated by printing the electrode layer paste used when evaluating the printability on the surface of a release layer 3000 times, measuring the amount of deposition of the electrode layer paste at the start and end of the printing, and calculating the fluctuation in the amount of deposition from the same. The amount of fluctuation changes depending on shedding of the electrode layer and sheet attack of the release layer. In this example, the case where the amount of fluctuation is less than 10% is judged as "G (good)" and the case where it is 10% or more is judged as "P (poor)".

Figure 9A:
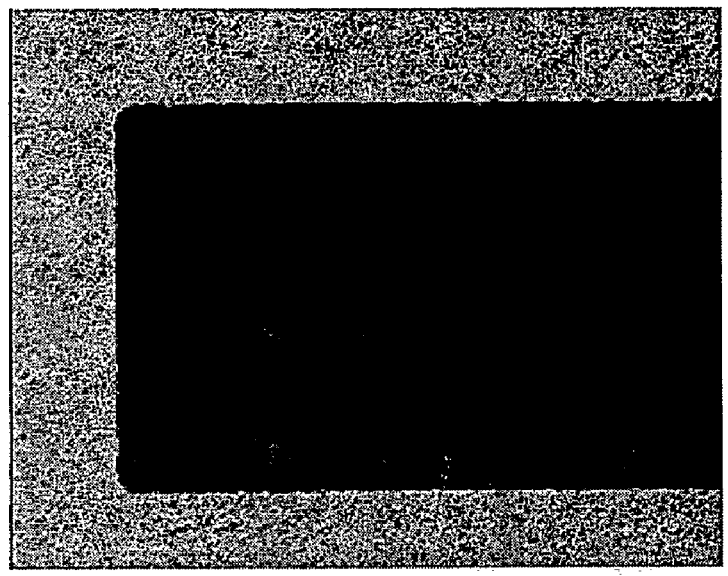
FIG. 9A is a photograph of the state of a release layer after printing the surface of the release layer of Example 1 with an electrode layer paste one time.
Figure 9B:
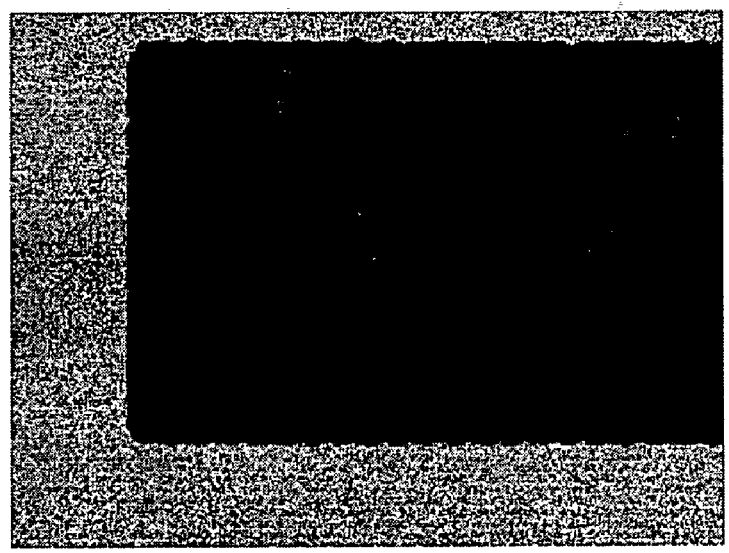
FIG. 9B is a photograph of the state of a release layer after printing the surface of the release layer of Example 1 with an electrode layer paste 3000 times.

As a result, the fluctuation of the amount of deposition of the electrode layer paste was 2.7%, the result was "G (good)". The state of the release layer after printing the electrode layer paste on the surface of the release layer one time and the state of the release layer after printing the electrode layer paste on the surface of the release layer 3000 times are shown by photographs in FIG. 9A and FIG. 9B. As shown in FIG. 9A and FIG. 9B, with the release layer of Example 1, it can be confirmed that even if printing it with electrode layer paste 3000 times, the state of the release layer is still good.

Peelability of Electrode Layer and Blank Pattern Layer

The peelability of the electrode layer and blank pattern layer from the release layer was evaluated by printing the electrode layer paste and blank pattern layer paste used for the evaluation of the printability on the surface of the release layer to form an electrode layer and blank pattern layer, then measuring the peeling strength when peeling off the electrode layer and blank pattern layer from the release layer.

Specifically, for example, a sheet in the state shown in FIG. 2B was attached to a sample table using two-sided adhesive tape (Scotch ST-416) so that the PET film (corresponding to the carrier sheet 20 in FIG. 2B) faces upward, then one end of the PET film was pulled up in a direction of 90 degrees with respect to the plane of the sheet at a speed of 8 mm/min. The force acting on the PET film carrier sheet 20 at that time (mN/cm) was measured as the peeling strength of the electrode layer and blank pattern layer (90 degree peeling test method).

By lowering the peeling strength, it is possible to facilitate peeling of the electrode layer and blank pattern layer from the PET film. Further, since damage to the electrode layer and blank pattern layer at the time of peeling can also be effectively prevented, the peeling strength should be low. On the other hand, if the peeling strength is lower than the peeling strength at the time of transfer to the later explained adhesive layer or green sheet, transfer to the adhesive layer or green sheet becomes difficult. Therefore, in this example, 10 mN/cm or more was deemed good. On the other hand, if the peeling strength is too high, peeling off the PET film from the electrode layer and blank pattern layer at the time of stacking becomes difficult. Therefore, in this example, 20 mN/cm or less was deemed good.

As a result, a suitable value of 15.8 mN/cm was shown. Due to this, the release layer of this example can maintain the necessary holding force to the PET film and efficient peeling work can be expected.

Surface Roughness

The surface roughness was evaluated by printing the electrode layer paste and blank pattern layer paste used for the evaluation of the printability described above on the surface of the release layer to form an electrode layer and blank pattern layer, then measuring the electrode layer and blank pattern surface for surface roughness (Ra: effective value of surface roughness) using a Kosaka Laboratories "Surfcorder (SE-30D)". If the surface roughness is large, short-circuit defects occur. Therefore, in this example, the case where the Ra was 0.1 μm or less was judged as good.

As a result, the Ra was a suitable value of 0.1 μm or less. Due to this, the merit of reduction of short-circuit defects can be expected.

The above results are shown in the later explained Table 1.

Example 2

The same procedure was performed as in Example 1 to prepare a release layer paste except for changing the contents of the polyvinyl acetal resin and the plasticizer (parts by weight) with respect to 100 parts by weight of ceramic powder so as to change the content of polyvinyl acetal (parts by weight) with respect to 100 parts by weight of ceramic powder and the ratio (P/B) of the ceramic powder and, the polyvinyl acetal and plasticizer as shown in Table 1. The results were similarly evaluated (Samples 1, 2, and to 6). The results are shown in Table 1.

TABLE 1

| Sample | | Ceramic powder (parts by weight) | Resin type | Amount of resin (parts by weight) | Amount of plasticizer (parts by weight) | P/B | Polymerization degree | Acetalization degree (mol %) |
|---|---|---|---|---|---|---|---|---|
| 1 | Comp. Ex. | 100 | Polyvinyl acetal | 12 | 6 | 5.56 | 2400 | 66 |
| 2 | Ex. | 100 | Polyvinyl acetal | 16 | 8 | 4.17 | 2400 | 66 |
| 3 | Ex. | 100 | Polyvinyl acetal | 24 | 12 | 2.78 | 2400 | 66 |
| 4 | Ex. | 100 | Polyvinyl acetal | 36 | 18 | 1.85 | 2400 | 66 |
| 5 | Ex. | 100 | Polyvinyl acetal | 50 | 25 | 1.33 | 2400 | 66 |
| 6 | Comp. Ex. | 100 | Polyvinyl acetal | 60 | 25 | 1.18 | 2400 | 66 |
| 7 | Comp. Ex. | 100 | PVB | 50 | 25 | 1.33 | 1450 | 69 |

| Sample | Amount of acetyl groups (mol %) | PET peeling strength (mN/cm) | Sheet attack | Printability | Sheet residue | Electrode printing state | Electrode layer and blank pattern layer peeling strength (mN/cm) | Surface roughness Ra (μm) |
|---|---|---|---|---|---|---|---|---|
| 1 | 3 | 10.5 | P | P | P | P | 16 | 0.151 |
| 2 | 3 | 10.5 | G | G | G | G | 16 | 0.092 |
| 3 | 3 | 10.5 | G | G | G | G | 15.5 | 0.088 |
| 4 | 3 | 10.5 | G | G | G | G | 16.5 | 0.082 |
| 5 | 3 | 10.5 | G | G | G | G | 17 | 0.078 |
| 6 | 3 | 10.5 | G | P* | P | P | 18.5 | 0.085 |
| 7 | 12 | 10.5 | P | P | P | P | 13 | 0.139 |

In the case of PVB of Sample 7, the acetalization degree indicates the butyralization degree.
"P*" indicates tackiness increased and sheet stuck to printing plate.

As shown in Table 1, if the P/B value is small, the printability deteriorates, while if the P/B value is large, along with printability, a tendency toward sheet attack and sheet residue is seen. From Table 1, it could be confirmed that when the P/B value is 1.33 to 5.56 (however, excluding 5.56) or when the content of the polyvinyl acetal is 12 to 50 parts by weight (however, excluding 12 parts by weight) with respect to 100 parts by weight of the ceramic powder, all of the characteristics were satisfied.

Example 3

The same procedure was performed as in Example 1 to prepare a release layer paste except for changing the polymerization degree of the polyvinyl acetal as shown in Table 2. The results were similarly evaluated (Samples 8 to 11). The results are shown in Table 2.

As shown in Table 2, if the polymerization degree is a too low 1700, sheet attack occurs. Further, if the polymerization degree is a too high 3700, the dispersability deteriorates. As opposed to this, it could be confirmed that if using a polyvinyl acetal with a polymerization degree in a suitable range (2000 to 3600), all of the characteristics were satisfied.

Example 4

The same procedure was performed as in Example 1 to prepare a release layer paste except for changing the acetalization degree of the polyvinyl acetal as shown in Table 3. The results were similarly evaluated (Samples 12 and 13). The results are shown in Table 3.

TABLE 2

Polymerization degree

| Sample | | Ceramic powder (parts by weight) | Resin type | Amount of resin (parts by weight) | Amount of plasticizer (parts by weight) | P/B | Polymerization degree | Acetalization degree (mol %) |
|---|---|---|---|---|---|---|---|---|
| 8 | Ref. Ex. | 100 | Polyvinyl acetal | 24 | 12 | 2.78 | 1700 | 66 |
| 9 | Ex. | 100 | Polyvinyl acetal | 24 | 12 | 2.78 | 2000 | 66 |
| 3 | Ex. | 100 | Polyvinyl acetal | 24 | 12 | 2.78 | 2400 | 66 |
| 10 | Ex. | 100 | Polyvinyl acetal | 24 | 12 | 2.78 | 3600 | 66 |
| 11 | Ref. Ex. | 100 | Polyvinyl acetal | 24 | 12 | 2.78 | 3700 | 66 |

| Sample | Amount of acetyl groups (mol %) | PET peeling strength (mN/cm) | Sheet attack | Printability | Sheet residue | Electrode printing state | Electrode layer and blank pattern layer peeling strength (mN/cm) | Surface roughness Ra (μm) |
|---|---|---|---|---|---|---|---|---|
| 8 | 3 | 10.5 | P | P | P | P | 14.4 | 0.164 |
| 9 | 3 | 10.5 | G | G | G | G | 17 | 0.087 |
| 3 | 3 | 10.5 | G | G | G | G | 15.5 | 0.088 |
| 10 | 3 | 10.5 | G | G | G | G | 13 | 0.08 |
| 11 | 3 | 10.5 | G | G | G | G | 9.5 | 0.132 |

TABLE 3

Acetalization degree

| Sample | | Ceramic powder (parts by weight) | Resin type | Amount of resin (parts by weight) | Amount of plasticizer (parts by weight) | P/B | Polymerization degree | Acetalization degree (mol %) |
|---|---|---|---|---|---|---|---|---|
| 3 | Ex. | 100 | Polyvinyl acetal | 24 | 12 | 2.78 | 2400 | 66 |
| 12 | Ex. | 100 | Polyvinyl acetal | 24 | 12 | 2.78 | 2400 | 72 |
| 13 | Ex. | 100 | Polyvinyl acetal | 24 | 12 | 2.78 | 2400 | 74 |

| Sample | Amount of acetyl groups (mol %) | PET peeling strength (mN/cm) | Sheet attack | Printability | Sheet residue | Electrode printing state | Electrode layer and blank pattern layer peeling strength (mN/cm) | Surface roughness Ra (μm) |
|---|---|---|---|---|---|---|---|---|
| 3 | 3 | 10.5 | G | G | G | G | 15.5 | 0.088 |
| 12 | 3 | 10.5 | G | G | G | G | 17 | 0.082 |
| 13 | 3 | 10.5 | G | G | G | G | 17 | 0.077 |

As shown in Table 3, it could be confirmed that when using a polyvinyl acetal with an acetalization degree in a suitable range (66 to 74 mol %), all of the characteristics were satisfied.

Example 5

The same procedure was performed as in Example 1 to prepare a release layer paste except for changing the content (parts by weight) of the plasticizer with respect to 100 parts by weight of ceramic powder as shown in Table 4. The results were similarly evaluated (Samples 14 to 18). The results are shown in Table 4.

tendency for the printability and state of printing of the electrodes to deteriorate is seen. From Table 4, it could be confirmed that particular with a content of plasticizer with respect to 100 parts by weight of the ceramic powder of 0 to 100 parts by weight (however, excluding 0 part by weight and 100 parts by weight), all of the characteristics were satisfied.

Example 6

The same procedure was performed as in Example 1 to prepare a release layer paste except for changing the peeling

TABLE 4

Amount of addition of plasticizer

| Sample | | Ceramic powder (parts by weight) | Resin type | Amount of resin (parts by weight) | Amount of plasticizer (parts by weight) | P/B | Polymerization degree | Acetalization degree (mol %) |
|---|---|---|---|---|---|---|---|---|
| 14 | Ref. Ex. | 100 | Polyvinyl acetal | 24 | 0 | 4.17 | 2400 | 66 |
| 15 | Ex. | 100 | Polyvinyl acetal | 24 | 5 | 3.45 | 2400 | 66 |
| 3 | Ex. | 100 | Polyvinyl acetal | 24 | 12 | 2.78 | 2400 | 66 |
| 16 | Ex. | 100 | Polyvinyl acetal | 24 | 25 | 2.04 | 2400 | 66 |
| 17 | Ex. | 100 | Polyvinyl acetal | 24 | 50 | 1.35 | 2400 | 66 |
| 18 | Ref. Ex. | 100 | Polyvinyl acetal | 24 | 100 | 0.81 | 2400 | 66 |

| Sample | Amount of acetyl groups (mol %) | PET peeling strength (mN/cm) | Sheet attack | Printability | Sheet residue | Electrode printing state | Electrode layer and blank pattern layer peeling strength (mN/cm) | Surface roughness Ra (μm) |
|---|---|---|---|---|---|---|---|---|
| 14 | 3 | 10.5 | G | G | G | G | 2.2 | 0.072 |
| 15 | 3 | 10.5 | G | G | G | G | 16.8 | 0.08 |
| 3 | 3 | 10.5 | G | G | G | G | 15.5 | 0.088 |
| 16 | 3 | 10.5 | G | G | G | G | 14.5 | 0.083 |
| 17 | 3 | 10.5 | G | G | G | G | 12.9 | 0.085 |
| 18 | 3 | 10.5 | G | P** | P | P | 9.3 | 0.14 |

"P**" indicates tackiness increased and sheet stuck to printing plate making continuous printing impossible.

As shown in Table 4, if the amount of the plasticizer is small, the peeling strength of the electrode layer and blank pattern layer tend to become large and peeling becomes more difficult. If the amount of the plasticizer becomes large, a strength of the side of the PET film (first supporting sheet) treated for releasing as shown in Table 5. The results were similarly evaluated (Samples 19 to 22). The results are shown in Table 5.

TABLE 5

PET type silicone

| Sample | | Ceramic powder (parts by weight) | Resin type | Amount of resin (parts by weight) | Amount of plasticizer (parts by weight) | P/B | Polymerization degree | Acetalization degree (mol %) |
|---|---|---|---|---|---|---|---|---|
| 19 | Ref. Ex. | 100 | Polyvinyl acetal | 24 | 12 | 2.78 | 2400 | 66 |
| 3 | Ex. | 100 | Polyvinyl acetal | 24 | 12 | 2.78 | 2400 | 66 |
| 20 | Ex. | 100 | Polyvinyl acetal | 24 | 12 | 2.78 | 2400 | 66 |
| 21 | Ex. | 100 | Polyvinyl acetal | 24 | 12 | 2.78 | 2400 | 66 |
| 22 | Ref. Ex. | 100 | Polyvinyl acetal | 24 | 12 | 2.78 | 2400 | 66 |

| Sample | Amount of acetyl groups (mol %) | PET peeling strength (mN/cm) | Sheet attack | Printability | Sheet residue | Electrode printing state | Electrode layer and blank pattern layer peeling strength (mN/cm) | Surface roughness Ra (μm) |
|---|---|---|---|---|---|---|---|---|
| 19 | 3 | 8 | G | P | P | P | 9.3 | 0.151 |
| 3 | 3 | 10.5 | G | G | G | G | 15.5 | 0.088 |
| 20 | 3 | 15.3 | G | G | G | G | 16.8 | 0.085 |
| 21 | 3 | 18.9 | G | G | G | G | 19.9 | 0.075 |
| 22 | 3 | 22.4 | G | G | G | G | 28.5 | 0.072 |

As shown in Table 5, if the peeling strength of the side of the PET film treated for peeling is small, the release layer tends to drop off the PET film along with the electrode layer and blank pattern layer formed on it, while if the peeling strength is large, the electrode layer and blank pattern layer tend to be harder to peel off and the stacking efficiency falls. From Table 5, it could be confirmed that particularly when the peeling strength was 8 to 20 mN/cm (however, excluding 8 mN/cm and 20 mN/cm), all of the characteristics were satisfied.

Example 7

The same procedure was followed as in Example 1 to form a release layer except for using a 38 μm thick PET film (first supporting sheet) treated on its surface for releasing by coating it with a release agent mainly comprised of an alkyd resin (peeling strength changed as shown in Table 6) and forming the release layer on this PET film. The results were similarly evaluated (Samples 23 to 26). The results are shown in Table 6.

tend to be harder to peel off and the stacking efficiency falls. From Table 6, it could be confirmed that particularly when the peeling strength was 50 to 130 mN/cm (however, excluding 50 mN/cm and 130 mN/cm), all of the characteristics were satisfied.

Example 8

First, the same procedure was performed as with Sample 3 of Example 1 to form a release layer. The solvents of the electrode layer paste and blank pattern layer paste were changed to the solvents shown in Tables 7 and 8 to evaluate the release layer sheet attack, printability, sheet residue, fluctuation in amount of deposition of electrode layer paste (state of printing of electrodes), peelability of the electrode layer and blank pattern layer, and surface roughness (Samples 27 to 39 and 40 to 42). The results are shown in Tables 7 and 8.

Note that in Samples 27 to 39 and 40 to 42 in Tables 7 and 8, the solvents were used in weight ratios of 50:50. That is, for example, in Sample 27, the solvents of the electrode layer paste and blank pattern layer paste were made terpineol:terpineol acetate=50:50 (weight ratio).

TABLE 6

PET type alkyd

| Sample | | Ceramic powder (parts by weight) | Resin type | Amount of resin (parts by weight) | Amount of plasticizer (parts by weight) | P/B | Polymerization degree | Acetalization degree (mol %) |
|---|---|---|---|---|---|---|---|---|
| 23 | Ref. Ex. | 100 | Polyvinyl acetal | 24 | 12 | 2.78 | 2400 | 66 |
| 24 | Ex. | 100 | Polyvinyl acetal | 24 | 12 | 2.78 | 2400 | 66 |
| 25 | Ex. | 100 | Polyvinyl acetal | 24 | 12 | 2.78 | 2400 | 66 |
| 26 | Ref. Ex. | 100 | Polyvinyl acetal | 24 | 12 | 2.78 | 2400 | 66 |

| Sample | Amount of acetyl groups (mol %) | PET peeling strength (mN/cm) | Sheet attack | Printability | Sheet residue | Electrode printing state | Electrode layer and blank pattern layer peeling strength (mN/cm) | Surface roughness Ra (μm) |
|---|---|---|---|---|---|---|---|---|
| 23 | 3 | 47.8 | P | P | P | P | 8.8 | 0.131 |
| 24 | 3 | 68.3 | G | G | G | G | 12.8 | 0.082 |
| 25 | 3 | 118.2 | G | G | G | G | 19.7 | 0.078 |
| 26 | 3 | 138.5 | G | G | G | G | 25.3 | 0.079 |

As shown in Table 6, if the peeling strength of the side of the PET film treated for releasing is small, the release layer tends to drop off the PET film along with the electrode layer and blank pattern layer formed on it, while if the peeling strength is large, the electrode layer and blank pattern layer Further, the samples shown in Table 7 are samples using a ratio of terpineol with each solvents of 50:50 (weight ratio), while the samples of Table 8 are samples using a ratio of each solvents with octanol of 50:50 (weight ratio).

TABLE 7

| Sample | | Electrode layer paste and blank paste solvent | | Sheet attack | Printability | Sheet residue | Electrode printing state | Electrode layer and blank pattern layer peeling strength (mN/cm) | Surface roughness Ra (μm) |
|---|---|---|---|---|---|---|---|---|---|
| 3 | Ex. | | Terpineol | G | G | G | G | 15.5 | 0.088 |
| 27 | Ex. | Terpineol | Terpineol acetate | G | G | G | G | 16.5 | 0.077 |
| 28 | Ex. | Terpineol | Dehydroterpineol | G | G | G | G | 15.5 | 0.082 |
| 29 | Ex. | Terpineol | Dehydroterpineol acetate | G | G | G | G | 16 | 0.080 |
| 30 | Ex. | Terpineol | kerosine | G | G | G | G | 17.5 | 0.095 |
| 31 | Ex. | Terpineol | xylene | G | G | G | G | 17.5 | 0.092 |
| 32 | Ex. | Terpineol | octanol | G | G | G | G | 15 | 0.087 |
| 33 | Ex. | Terpineol | nonanol | G | G | G | G | 14.5 | 0.082 |
| 34 | Ex. | Terpineol | decanol | G | G | G | G | 14 | 0.078 |
| 35 | Ex. | Terpineol | undecanol | G | G | G | G | 15 | 0.080 |
| 36 | Ex. | Terpineol | benzyl acetate | G | G | G | G | 15.5 | 0.077 |
| 37 | Ex. | Terpineol | carbitol | G | G | G | G | 14.5 | 0.073 |

TABLE 7-continued

| Sample | | Electrode layer paste and blank paste solvent | | Sheet attack | Printability | Sheet residue | Electrode printing state | Electrode layer and blank pattern layer peeling strength (mN/cm) | Surface roughness Ra (μm) |
|---|---|---|---|---|---|---|---|---|---|
| 38 | Ex. | Terpineol | butyl carbitol | G | G | G | G | 15.5 | 0.092 |
| 39 | Ex. | Terpineol | butyl carbitol acetate | G | G | G | G | 15 | 0.083 |

TABLE 8

| Sample | | Electrode layer paste and blank paste solvent | | Sheet attack | Printability | Sheet residue | Electrode printing state | Electrode layer and blank pattern layer peeling strength (mN/cm) | Surface roughness Ra (μm) |
|---|---|---|---|---|---|---|---|---|---|
| 32 | Ex. | Terpineol | octanol | G | G | G | G | 15 | 0.087 |
| 40 | Ex. | Terpineol acetate | octanol | G | G | G | G | 14.5 | 0.075 |
| 41 | Ex. | Dehydroterpineol | octanol | G | G | G | G | 16 | 0.078 |
| 42 | Ex. | Dehydroterpineol acetate | octanol | G | G | G | G | 15.5 | 0.080 |

From the Tables 7 and 8, it could be confirmed that even if changing the solvents of the electrode layer paste and blank pattern layer paste to the solvents shown in Tables 7 and 8, all of the required characteristics were satisfied.

Comparative Example 1

The polyvinyl acetal of Example 1 was changed to polyvinyl butyral to prepare a release layer paste. Specifically, the procedure was as follows.

Preparation of Release Layer Paste

Preparation of Additive Slurry

First, an additive (subcomponent) material mixture of the same composition as in Example 1 was prepared.

Next, the additive material mixture in an amount of 4.3 parts by weight, ethyl alcohol in 3.1 parts by weight, n-propanol in 3.1 parts by weight, xylene in 1.1 parts by weight, and a polyethylene glycol-based dispersion agent in 0.04 part by weight were mixed and pulverized using a ball mill to obtain an additive slurry. The mixing and pulverization were performed using a 250 cc polyethylene resin vessel charged with 450 g of 2 mmϕ ZrO$_2$ media at a peripheral speed of 45 m/min for 20 hours. The pulverized additive material had a particle size of a median size of about 0.1 μm.

Preparation of Primary Slurry

Next, the entire amount of the obtained additive slurry, BaTiO$_3$ powder of an average particle size of 0.1 μm (BT-01/Sakai Chemical Industry) in an amount of 100 parts by weight, ethyl alcohol in 45.88 parts by weight, n-propanol in 45.88 parts by weight, xylene in 22.4 parts by weight, a dioctyl phthalate (DOP) plasticizer in 3.03 parts by weight, a mineral spirits in 7.31 parts by weight, and a polyethylene glycol-based dispersion agent in 1.0 part by weight were mixed and pulverized using a ball mill. The mixing and pulverization were performed using a 1 liter polyethylene resin vessel charged with 18 g of 2 mmϕ ZrO$_2$ media under conditions of a peripheral speed of 45 m/min for 4 hours.

After this (after mixing for 4 hours), a 15% resin solid concentration lacquer comprised of a polyvinyl butyral (PVB) resin (polymerization degree of 1450, butyralization degree of 69%, amount of residual acetyl groups of 12%) dissolved in ethyl alcohol:n-propanol=1:1 was additionally added in an amount of 41.6 parts by weight (added to give amount of addition of polyvinyl butyral resin, with respect to powder (barium titanate+additive), of 6 wt %) and the mixture was further mixed for 16 hours by a ball mill to obtain a primary slurry. The obtained primary slurry had a nonvolatile concentration of 41.3 wt %.

Note that, in this comparative example as well, the above the BaTiO$_3$ powder and the additive material mixture were used as the ceramic powder (average particle size 0.1 μm).

Dilution of Primary Slurry

In this example, a high pressure dispersed and low concentration slurry is difficult to produce by a single process, so first a relatively high concentration primary slurry is produced, then this primary slurry is diluted to produce the release layer paste.

Specifically, the entire amount of the obtained primary slurry is mixed with the following binder lacquer using a ball mill to give a total amount of the prepared polyvinyl butyral resin added of 9 parts by weight and a concentration of nonvolatile ingredients of 15%. The mixing was performed using a 3 liter polyethylene resin vessel at a peripheral speed of 45 m/min for 4 hours. Note that the binder lacquer was prepared by preparing ethyl alcohol in an amount of 244.81 parts by weight, n-propanol in 244.81 parts by weight, xylene in 131.83 parts by weight, a dioctyl phthalate (DOP) plasticizer in 22.98 parts by weight, and PVB 15% lacquer in 303.34 parts by weight, mixing these, and heating them to dissolve at 50° C.

The mixed slurry had a concentration of nonvolatile ingredients of 15%, an amount of PVB resin with respect to 100 parts by weight of ceramic powder of 50 parts by weight, a content of the plasticizer with respect to 100 parts by weight of the PVB resin of 50 parts by weight (25 parts by weight with respect to 100 parts by weight of ceramic powder), and a ratio (P/B) of the ceramic powder and, the PVB and plasticizer of 1.33 (Table 1, Sample 7).

High Pressure Dispersion Treatment

The obtained mixed slurry was treated in the same way as in Example 1 so as to prepare a release layer paste.

Formation of Release Layer

The prepared release layer paste was coated and dried on the surface of the PET film (first supporting sheet) used in Example 1 under similar conditions to form a release layer with a dry thickness of 0.2 μm which was then evaluated in the same way as in Example 1. The results are shown in Table 1.

As shown in Table 1, it could be confirmed that sheet attack and sheet residue occurred and the printability also deteriorated.

Figure 10A:
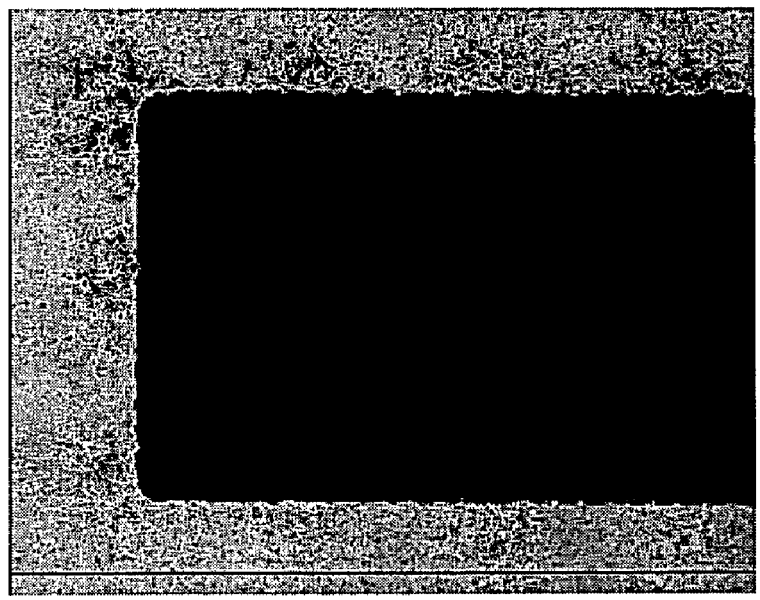
FIG. 10A is a photograph of the state of a release layer after printing the surface of the release layer of Comparative Example 1 with an electrode layer paste one time.
Figure 10B:
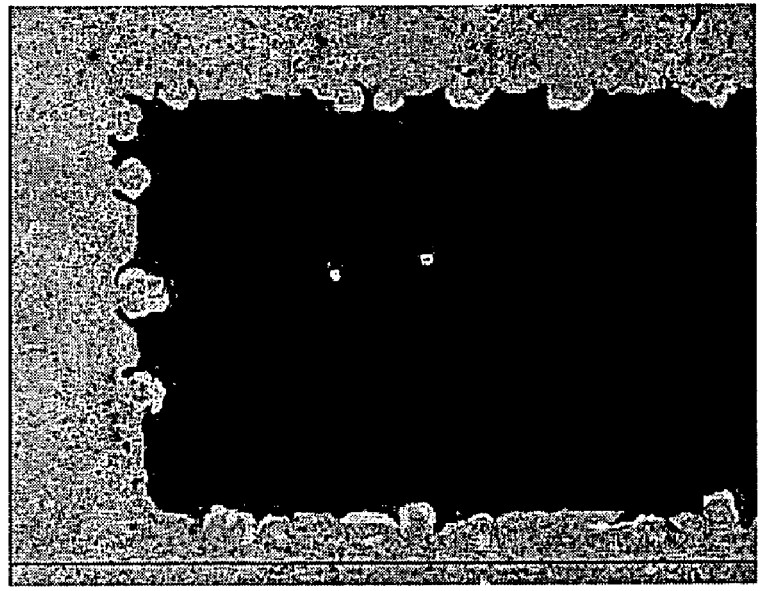
FIG. 10B is a photograph of the state of a release layer after printing the surface of the release layer of Comparative Example 1 with an electrode layer paste 3000 times.

Further, the amount of deposition of electrode layer paste fluctuated (state of electrode printing) by 28%, the result was "P (poor)". The state of the release layer after printing the electrode layer paste on the surface of the release layer one time and the state of the release layer after printing the electrode layer paste on the surface of the release layer 3000 times are shown by photographs in FIG. 10A and FIG. 10B. As shown in FIG. 10A and FIG. 10B, with the release layer of Comparative Example 1, it can be confirmed that if printing it with electrode layer paste 3000 times, the sheet residue of the release layer scatters and the state deteriorates.

Due to this, the significance of Examples 1 to 8 could be confirmed.

Example 9

Green Sheet Paste

First, an additive (subcomponent) material mixture of the same composition as Example 1 (Table 1, Sample 3) was prepared.

Next, the obtained additive material mixture in an amount of 4.3 parts by weight, ethyl alcohol in 3.11 parts by weight, n-propanol in 3.11 parts by weight, xylene in 1.11 parts by weight, and a dispersion agent in 0.04 part by weight were mixed and pulverized using a ball mill to obtain an additive slurry. The mixing and pulverization were performed using a 250 cc polyethylene resin vessel, charging it with 450 g of 2 mmφ $ZrO_2$ media, and operating it at a peripheral speed of 45 m/min for 16 hours. Further, the additive material after pulverization had a particle size of a median size of 0.1 μm.

Next, the obtained additive slurry in an amount of 11.65 parts by weight, $BaTiO_3$ powder (BT-02/Sakai Chemical Industry) in 100 parts by weight, ethyl alcohol in 35.32 parts by weight, n-propanol in 35.32 parts by weight, xylene in 16.32 parts by weight, dioctyl phthalate (plasticizer) in 2.61 parts by weight, a mineral spirits in 7.3 parts by weight, a dispersion agent in 2.36 parts by weight, an anti-static aid in 0.42 part by weight, an organic vehicle in 33.74 parts by weight, MEK in 43.81 parts by weight, and 2-butoxyethanol in 43.81 parts by weight were mixed using a ball mill to obtain a green sheet paste.

Further, the mixing by the ball mill was performed using a 500 cc polyethylene resin vessel, charging it with 900 g of 2 mmφ $ZrO_2$ media, and operating it under conditions of a peripheral speed of 45 m/min for 20 hours. Further, the above organic vehicle was prepared by stirring and dissolving a polyvinyl butyral resin having a polymerization degree of 1450 and a butyralization degree of 69% (made by Sekisui Chemical Industry) in an amount of 15 parts by weight into ethanol in 42.5 parts by weight and propanol in 42.5 parts by weight at a temperature of 50° C. That is, the resin content in the organic vehicle (amount of polyvinyl butyral resin) was made 15 wt %.

Adhesive Layer Paste

A butyral resin (polymerization degree of 800, butyralization degree of 77%) in an amount of 2 parts by weight, MEK in 98 parts by weight, and DOP (dioctyl phthalate) in 1 part by weight were stirred to dissolve to prepare an adhesive layer paste.

Preparation of Samples of Multilayer Ceramic Capacitors

The release layer pastes, electrode layer pastes, and blank pattern layer pastes prepared in Example 1 and the green sheet paste and adhesive layer paste prepared in this example were used in the following way to produce multilayer ceramic capacitors 2 shown in FIG. 1.

Formation of Green Sheet

First, in the same way as Example 1, a PET film was formed with release layer (dry thickness of 0.1 μm), and the release layer was formed on its surface with an electrode layer and blank pattern layer (to dry thickness of 1 μm).

Next, the electrode layer and blank pattern were coated with the above green sheet paste by a die coater, then dried to form a green sheet and obtain a green sheet 10a having an electrode layer 12a and blank pattern 24. The cooling rate was made 50 m/min, and the drying was performed using a drying oven with an oven temperature of 80° C. The green sheets were formed to give thicknesses when dry of 1 μm.

Formation of Adhesive Layer and Transfer of Adhesive Layer

First, another PET film (second supporting sheet) was prepared. This PET film was coated with the above adhesive layer paste by a die coater, then dried to form an adhesive layer. The coating speed was made 70 m/min, while the drying was performed using a drying oven with an oven temperature of 80° C. The adhesive layer was formed to give a thickness after drying of 0.1 μm. Further, the second supporting sheet, unlike the first supporting sheet, was treated on its surface with a silicone-based resin to facilitate releasing.

Next, the adhesive layer 28 was transferred onto the green sheet 10a having the electrode layer 12a and blank pattern 24 by the method shown in FIG. 3 to form a laminate unit U1a. At the time of transfer, a pair of rolls was used. The pressing force was made 0.1 MPa, the transfer temperature 80° C., and the transfer speed 2 m/min. It was confirmed that the transfer could be performed well.

Preparation of Green Chip

First, a plurality of external layer green sheets formed to thicknesses of 10 μm were stacked to give a thickness at the time of stacking of about 50 μm so as to form an external layer forming the cap part (cover layer) of the multilayer capacitor after firing. Further, the external layer green sheets were green sheets formed using the above produced green sheet coating to give a thickness after drying of 10 μm.

Next, the method shown in FIG. 3 and FIG. 4 was used to stack 100 of the above produced laminate units. Further, a plurality of external layer green sheets formed to thicknesses of 10 μm were stacked to give a thickness at the time of stacking of about 50 μm so as to form an external layer forming the cap part (cover layer) of the multilayer capacitor after firing. Further, the obtained laminate was pressed under conditions of 100 MPa and 70° C., then cut by a dicing machine to obtain a pre-fired green chip.

Preparation of Sintered Body

Next, the final laminate was cut to a predetermined size and treated to remove the binder, fire it, and anneal it (heat treat it) so as to prepare a chip-shaped sintered body.

The binder was removed at a temperature elevation rate of 50° C./hour, a holding temperature of 240° C., a holding time of 8 hours, and an atmospheric gas of the air. The firing was performed at a temperature elevation rate of 300° C./hour, a holding temperature of 1200° C., a holding time of 2 hours, a cooling rate of 300° C./hour, and an atmospheric gas of a mixed gas of $N_2$ gas controlled to a dew point of 20° C. and $H_2$ (5%). The annealing (reoxidation) was performed at a holding time of 3 hours, a cooling rate of 300° C./hour, and an atmospheric gas of $N_2$ gas controlled to a dew point of 20° C. Further, the atmospheric gas was wet using a wetter at a water temperature of 0 to 75° C.

Next, the end faces of the chip-shaped sintered body were polished by sand blasting, then an In—Ga alloy paste was coated on the ends and then fired to form external electrodes and obtain a sample of a multilayer ceramic capacitor of the configuration shown in FIG. 1.

Measurement of Short-Circuit Defect Rate

The short-circuit defect rate was measured by preparing 50 capacitor samples and investigating the number at which short-circuit defects occurred. Specifically, an insulation resistance meter (Hewlett Packard E2377A Multimeter) was used to measure the resistance values. Samples with resistance values of 100 kΩ or less were deemed as short-circuit defect samples. The ratio of short-circuit defect samples to all measured samples was defined as the short-circuit defect rate. In this example, a short-circuit defect rate of 10% or less was deemed as good. As a result, the short-circuit defect rate were 6%, that is, very good results were obtained.

The invention claimed is:

1. A release layer paste used for producing a multilayer type electronic device, wherein:

said release layer paste is used in combination with an electrode layer paste, the electrode layer paste including terpineol, dehydroterpineol, terpineol acetate, or dehydroterpineol acetate;

said release layer paste includes a ceramic powder, organic vehicle, plasticizer, and dispersion agent;

said organic vehicle contains a binder having polyvinyl acetal as its main ingredient;

a ratio (P/B) of said ceramic powder and, said binder and plasticizer is controlled to 1.33 to less than 5.56;

said binder is contained in an amount of more than 12 to 50 parts by weight with respect to 100 parts by weight of said ceramic powder;

said polyvinyl acetal has a polymerization degree of 2000 to 3600 and an acetalization degree of 66 to 74 mol %, said plasticizer is at least one plasticizer selected from the group of dibutyl phthalate (DBP), dioctyl phthalate (DOP), and butylbenzyl phthalate (BBP) and is contained in an amount of more than 0 to less than 100 parts by weight with respect to 100 parts by weight of said ceramic powder;

said ceramic powder has an average particle size of 0.2 μm or less;

said dispersion agent is a polyethylene glycol-based dispersion agent and is contained in an amount of 1 to 3 parts by weight with respect to 100 parts by weight of said ceramic powder; and said organic vehicle contains a solvent comprised of at least one of ethyl alcohol, methylethylketone, methylisobutylketone, propanol, xylene, and toluene and contained so as to give a concentration of nonvolatile ingredients of 5 to 20 wt %.

2. The release layer paste as set forth in claim 1, wherein said electrode layer paste used in combination with further contains at least one solvent selected from the group of kerosine, xylene, octanol, nonanol, decanol, undecanol, benzyl acetate, carbitol, butyl carbitol, and butyl carbitol acetate.

* * * * *